(12) United States Patent
Tang et al.

(10) Patent No.: US 8,767,457 B2
(45) Date of Patent: Jul. 1, 2014

(54) APPARATUS RELATING TO A MEMORY CELL HAVING A FLOATING BODY

(71) Applicant: Micron Technology, Inc., Boise, ID (US)

(72) Inventors: Sanh D. Tang, Boise, ID (US); Mike N. Nguyen, Portland, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/043,476

(22) Filed: Oct. 1, 2013

(65) Prior Publication Data

US 2014/0035015 A1 Feb. 6, 2014

Related U.S. Application Data

(60) Continuation of application No. 13/403,596, filed on Feb. 23, 2012, now Pat. No. 8,547,739, which is a division of application No. 12/410,207, filed on Mar. 24, 2009, now Pat. No. 8,148,780.

(51) Int. Cl.

| | |
|---|---|
| *G11C 11/34* | (2006.01) |
| *H01L 27/108* | (2006.01) |
| *H01L 27/12* | (2006.01) |
| *H01L 29/78* | (2006.01) |

(52) U.S. Cl.
CPC ...... *H01L 27/10802* (2013.01); *H01L 27/1203* (2013.01); *H01L 29/7841* (2013.01)
USPC ...... 365/174; 365/182; 365/149; 365/185.18; 257/238; 257/413; 438/201; 438/211

(58) Field of Classification Search
USPC ............. 365/174, 182, 149, 185.18; 257/238, 257/413; 438/201, 211
See application file for complete search history.

(56) References Cited

U.S. PATENT DOCUMENTS

| 5,998,847 A | 12/1999 | Assaderaghi et al. |
|---|---|---|
| 6,621,725 B2 | 9/2003 | Ohsawa |

(Continued)

FOREIGN PATENT DOCUMENTS

| KR | 1020000016924 A | 3/2000 |
|---|---|---|
| KR | 1020000056247 | 9/2000 |

(Continued)

OTHER PUBLICATIONS

Ban et al., A Scaled Floating Body Cell (FBC) Memory with High-k-Metal Gate on Thin-Silicon and Thin-BOX for 16-nm Technology Node and Beyond, 2008 Symposium on VLSI Technology Digest of Technical Papers, pp. 92-93.

(Continued)

*Primary Examiner* — Han Yang
(74) *Attorney, Agent, or Firm* — TraskBritt

(57) ABSTRACT

An apparatus is disclosed for a memory cell having a floating body. A memory cell may include a transistor over an insulation layer, the transistor including a source, and a drain. The memory cell may also include a floating body including a first region positioned between the source and the drain, a second region positioned remote from each of the source and drain, and a passage extending through the insulation layer and coupling the first region to the second region. Additionally, the memory cell may include a bias gate at least partially surrounding the second region and configured for operably coupling to a bias voltage. Furthermore, the memory cell may include a plurality of dielectric layers, wherein each outer vertical surface of the second region has a dielectric layer of the plurality adjacent thereto.

23 Claims, 17 Drawing Sheets

(56) References Cited

U.S. PATENT DOCUMENTS

| | | | |
|---|---|---|---|
| 6,707,095 | B1 | 3/2004 | Chidambarrao et al. |
| 6,927,414 | B2 | 8/2005 | Ouyang et al. |
| 7,184,312 | B2 | 2/2007 | Bhattacharyya |
| 7,440,317 | B2 | 10/2008 | Bhattacharyya |
| 7,463,523 | B2 | 12/2008 | Shino |
| 7,586,153 | B2 | 9/2009 | Hoentschel et al. |
| 7,608,927 | B2 | 10/2009 | Gonzalez et al. |
| 7,741,673 | B2 | 6/2010 | Tak et al. |
| 8,148,780 | B2 | 4/2012 | Tang et al. |
| 2003/0173626 | A1* | 9/2003 | Burr .............................. 257/369 |
| 2005/0037548 | A1 | 2/2005 | Wieczorek et al. |
| 2005/0250279 | A1 | 11/2005 | Son et al. |
| 2006/0006468 | A1 | 1/2006 | Fazan et al. |
| 2007/0012988 | A1 | 1/2007 | Bhattacharyya |
| 2007/0133309 | A1 | 6/2007 | Malinge et al. |
| 2007/0138530 | A1 | 6/2007 | Okhonin |
| 2007/0200157 | A1 | 8/2007 | Shino |
| 2008/0061346 | A1 | 3/2008 | Tang et al. |
| 2008/0099811 | A1 | 5/2008 | Tak et al. |
| 2008/0123418 | A1 | 5/2008 | Widjaja |
| 2008/0205133 | A1 | 8/2008 | Gonzalez et al. |
| 2009/0002654 | A1 | 1/2009 | Warrick et al. |
| 2009/0010056 | A1 | 1/2009 | Kuo et al. |
| 2009/0016101 | A1 | 1/2009 | Okhonin et al. |
| 2009/0022003 | A1 | 1/2009 | Song et al. |
| 2010/0008139 | A1 | 1/2010 | Bae |
| 2010/0246285 | A1 | 9/2010 | Tang et al. |
| 2010/0254186 | A1 | 10/2010 | Tang |

FOREIGN PATENT DOCUMENTS

| | | |
|---|---|---|
| KR | 1020000056248 A | 9/2000 |
| KR | 1020040108552 A | 12/2004 |
| KR | 100612710 B1 | 8/2006 |
| KR | 100801707 B1 | 2/2008 |
| KR | 1020080027946 A | 3/2008 |
| KR | 100819553 B1 | 4/2008 |
| KR | 1020080041737 A | 5/2008 |

OTHER PUBLICATIONS

Butt et al., Scaling Limits of Double-Gate and Surround Gate Z-RAM Cells, IEEE Transactions on Electron Devices, vol. 54, No. 9, Sep. 2007, pp. 2255-2262.

International Search Report for International Application No. PCT/US2010/027507 mailed Oct. 26, 2010, 3 pages.

International Written Opinion for International Application No. PCT/US2010/027507 mailed Oct. 26, 2010, 4 pages.

International Preliminary Report on Patentability for International Application No. PCT/US2010/027507 dated Sep. 27, 2011, 5 pages.

Nagoga et al., Retention Characteristics of Zero-Capacitor RAM (Z-RAM) Cell Based on FinFET and Tri-Gate Devices, 2005 IEEE International SOI Conferences, pp. 203-204.

Okhonin et al., New Generation of Z-RAM, 2007, IEEE, pp. 925-928.

Ranica et al., Scaled 1T-Bulk Devices Built with CMOS 90nm Technology for Low-Cost eDRAM Applications, 2005 Symposium on VLSI Technology Digest of Technical Papers, pp. 38-39.

\* cited by examiner

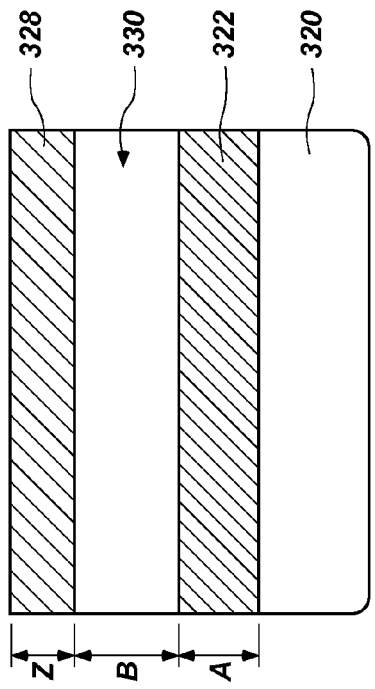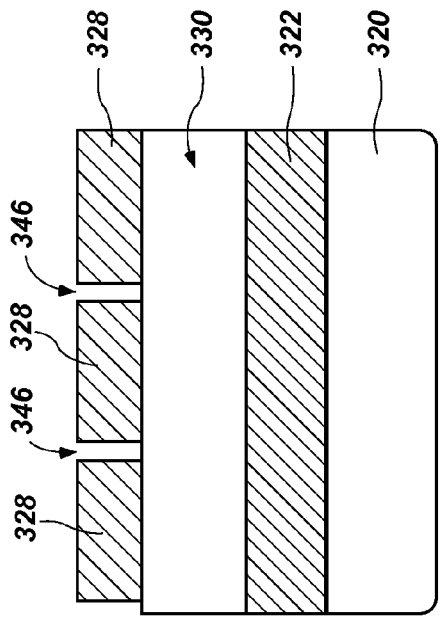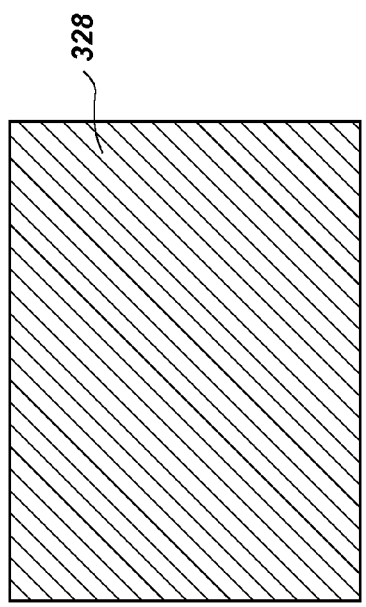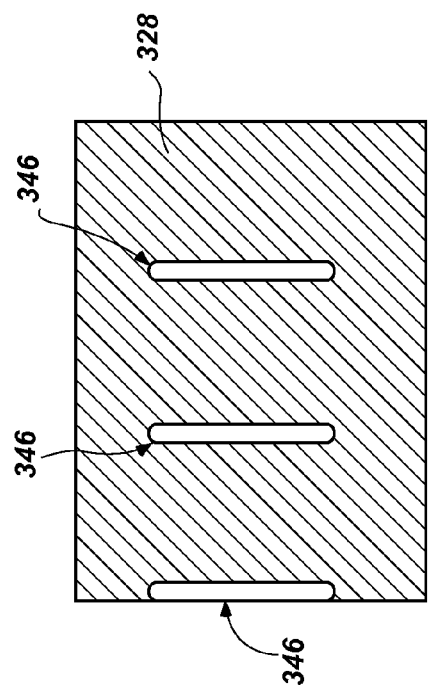

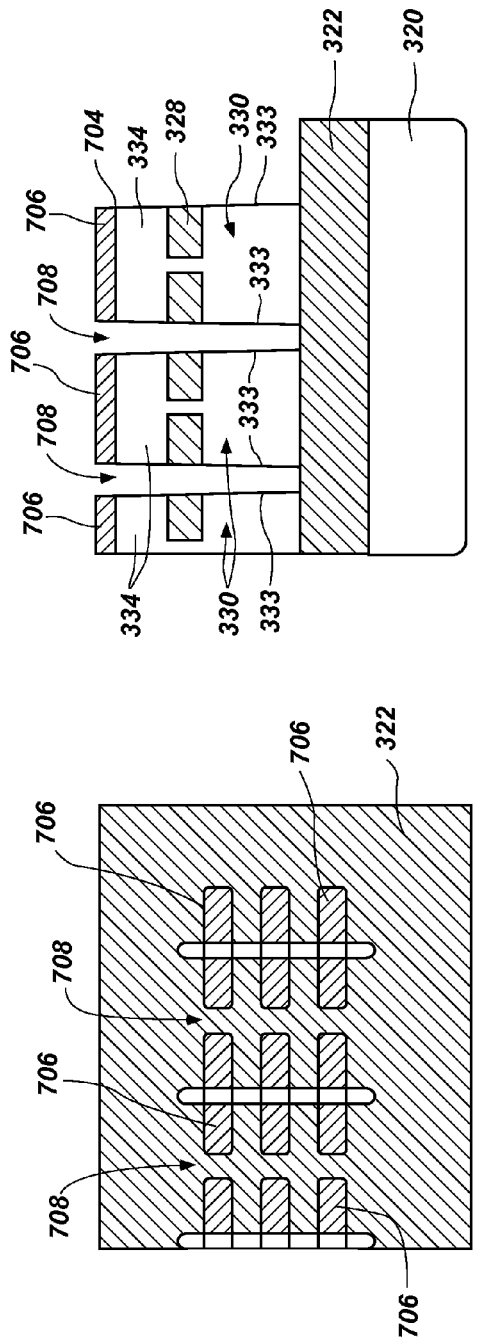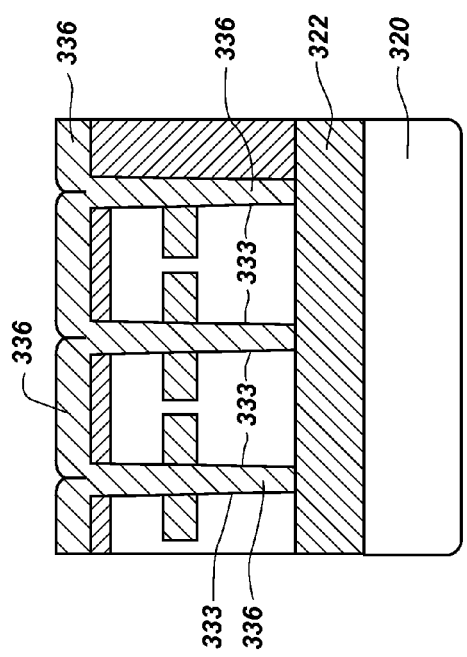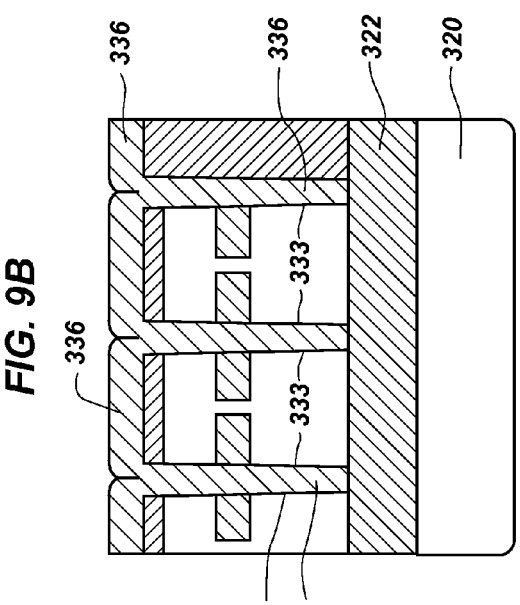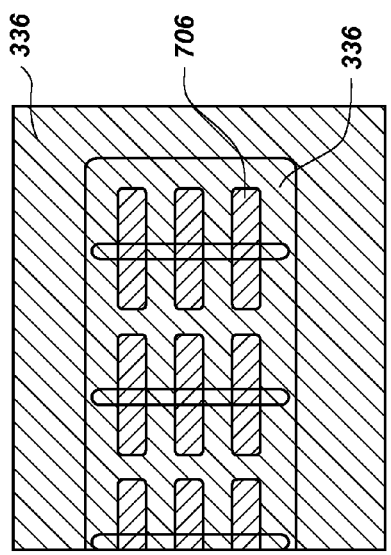

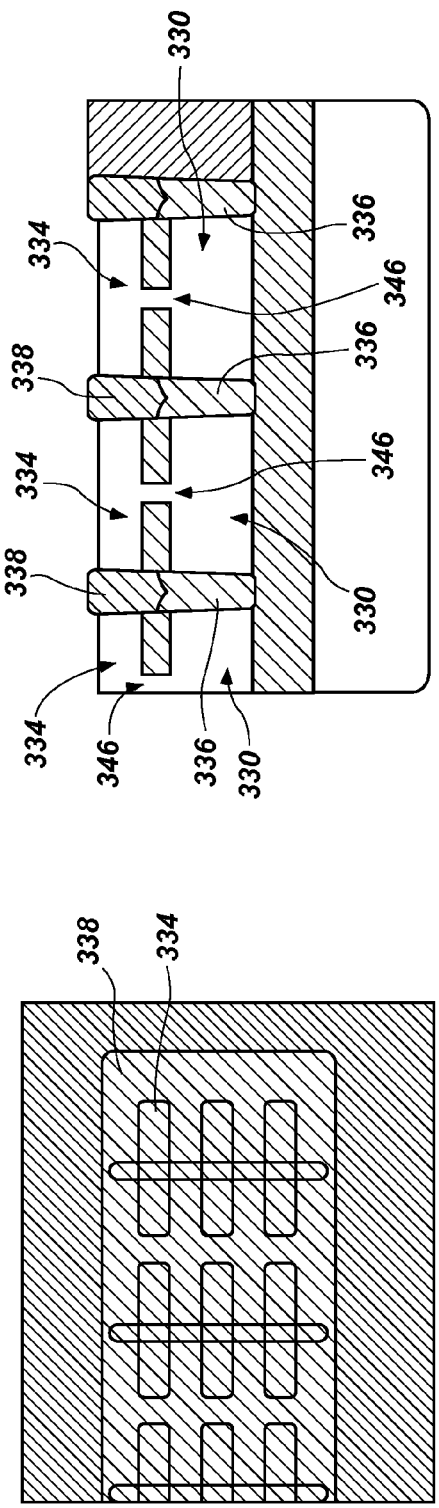
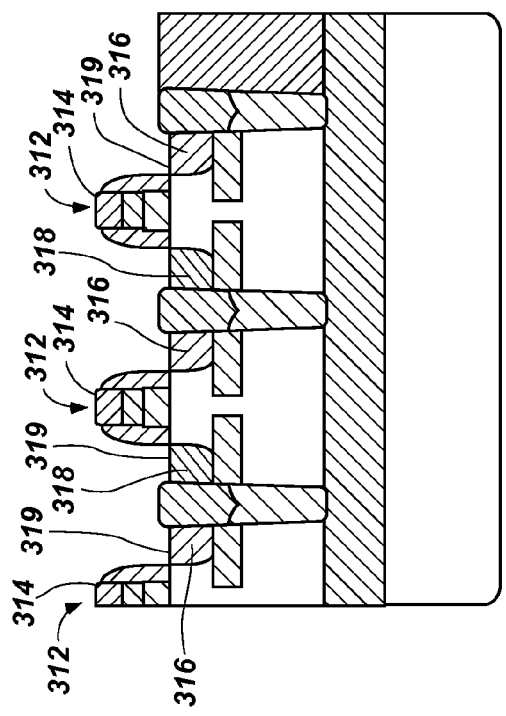
FIG. 13A
FIG. 13B
FIG. 14

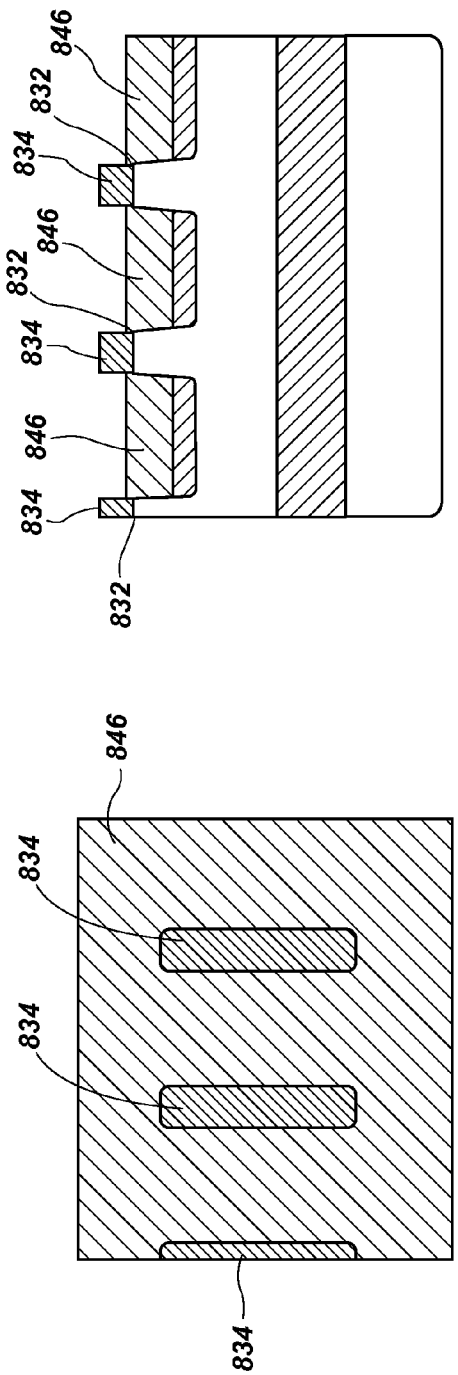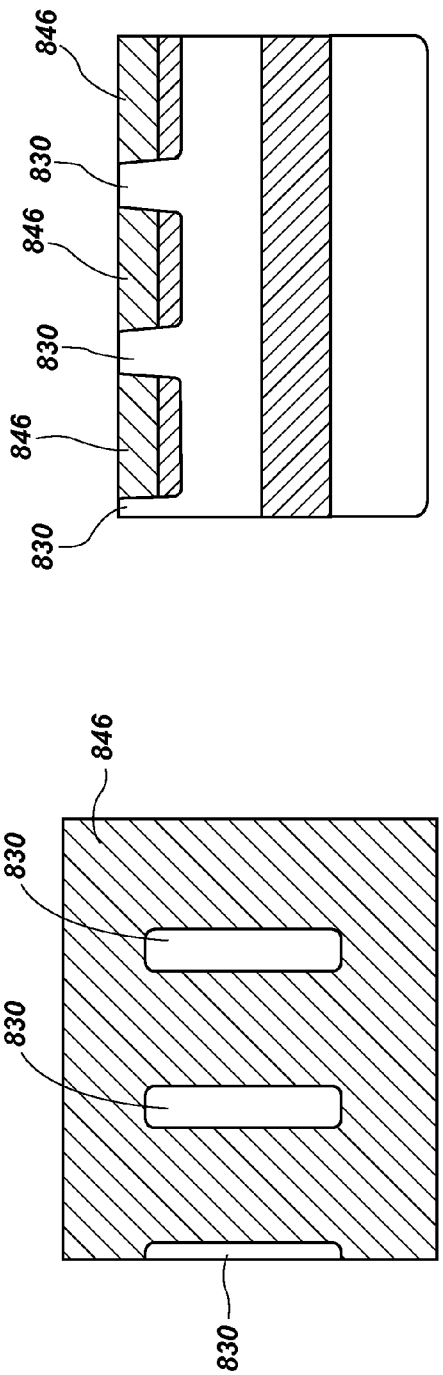

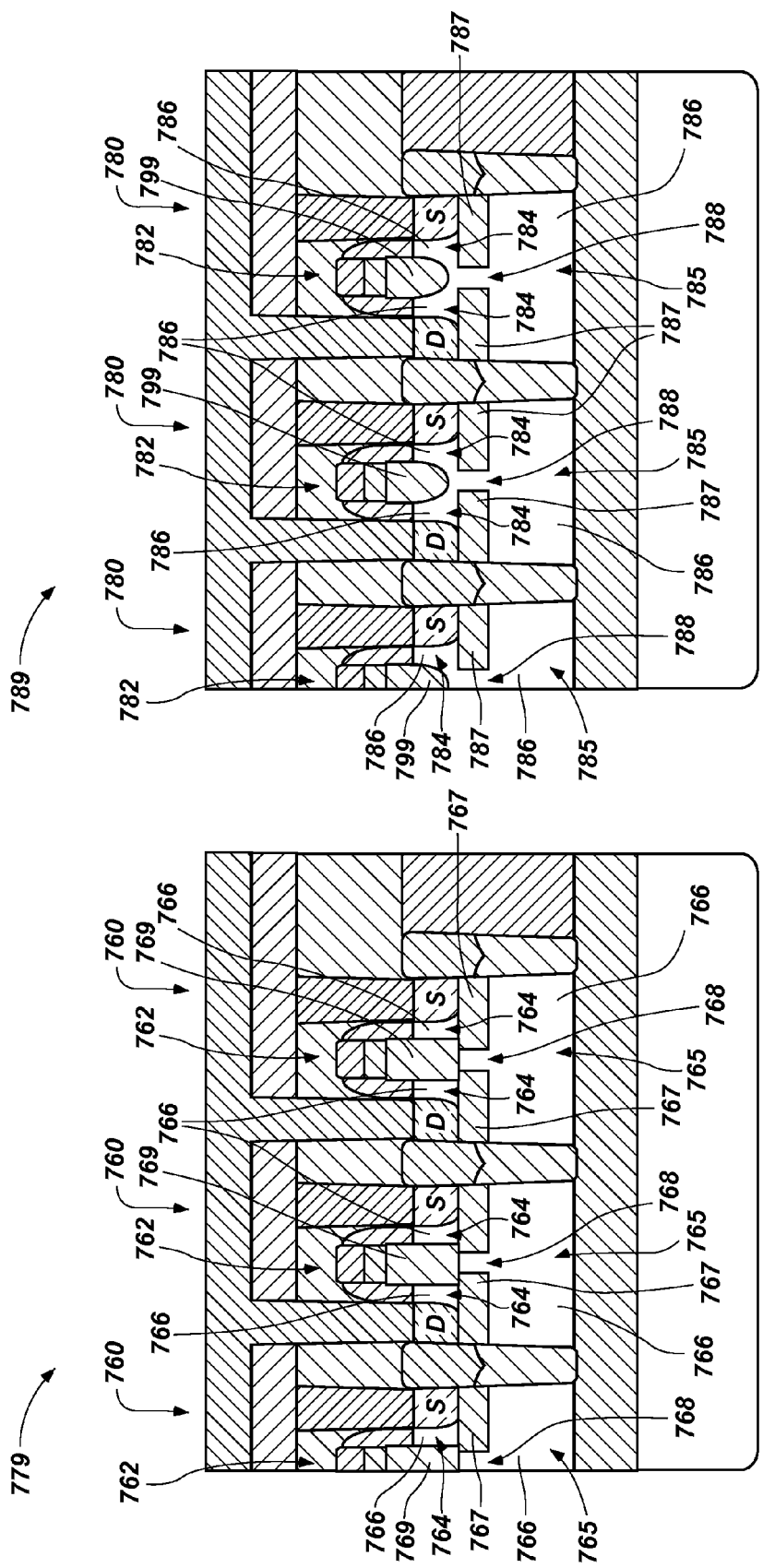

APPARATUS RELATING TO A MEMORY CELL HAVING A FLOATING BODY

CROSS-REFERENCE TO RELATED APPLICATIONS

This application is a continuation of U.S. patent application Ser. No. 13/403,596, filed Feb. 23, 2012, now U.S. Pat. No. 8,547,739, issued Oct. 1, 2013, which application is a divisional of U.S. patent application Ser. No. 12/410,207, filed Mar. 24, 2009, now U.S. Pat. No. 8,148,780, issued Apr. 3, 2012, the entire disclosure of each of which is incorporated herein by this reference. This application is also related to U.S. patent application Ser. No. 12/419,658, filed Apr. 7, 2009, now U.S. Pat. No. 7,929,343, issued Apr. 19, 2011, and U.S. patent application Ser. No. 13/073,595, filed Mar. 28, 2011, now U.S. Pat. No. 8,213,225, issued Jul. 3, 2012.

TECHNICAL FIELD

Embodiments of the present invention relate generally to memory cells. More particularly, embodiments of the present invention relate to a memory cell having a floating body, to devices and systems utilizing same, and to methods of forming and methods of operating same.

BACKGROUND

A conventional memory, for example, a DRAM, may include one transistor and one capacitor. However, there are limitations to the scalability of a conventional memory, due to the capacitor, in particular, the size of the capacitor. As a result, memories including one transistor (1T) and no capacitor as a memory cell, referred to as "capacitor-less" memories, have been developed. A capacitor-less memory cell may include a floating body (i.e., a body that is electrically floated).

Generally, a conventional capacitor-less memory cell utilizes a silicon-on-insulator (SOI) wafer and identifies data controlling the floating body voltage by accumulating a majority carrier (either holes or electrons) in a floating body or by emitting the majority carrier from the floating body. As understood by a person having ordinary skill in the art, a logic "1" may be written to and stored in a memory cell by causing the majority carriers to accumulate and be held in the floating body. As such, when the majority carrier is accumulated in the floating body, this state is generally referred to as a data "1" state. A logic "1" may be erased (i.e., logic "0" is written) by removing the majority carriers from the floating body. As such, when the majority carrier is evacuated from the floating body, this state is generally referred to as a data "0" state. As also understood by a person having ordinary skill in the art, the stored charge in the transistor floating body affects a threshold voltage ($V_T$) of the memory cell transistor. A lower threshold voltage ($V_T$) increases the current through the memory cell transistor, and a higher threshold voltage ($V_T$) decreases the current though the transistor. The current through the memory cell transistor is used to determine the state of the memory cell.

FIG. 1 illustrates an example of a conventional floating body memory cell 10. Memory cell 10 includes a transistor 12 having a gate region 16, a source region 20, and a drain region 22. Source region 20 and drain region 22 are formed in silicon layer 26 with a floating body region 18 being defined therebetween. Moreover, floating body region 18 is disposed on a buried insulator 24 which overlies a substrate 28.

In operation, a logic "1" may be written to memory cell 10 by applying positive voltages to each of gate region 16 and drain region 22, wherein the positive voltage applied to drain region 22 is at a higher potential than the positive voltage applied to gate region 16. A lower positive gate potential and a higher positive drain potential produces, through impact ionization, holes (not shown) in floating body region 18. To write a logic "0", gate region 16 may be coupled to a positive voltage and drain region 22 may be coupled to a negative voltage. The negative potential at drain region 22 causes an inverted channel and removes the holes from floating body region 18. Furthermore, to read a charge stored within memory cell 10, gate region 16 and drain region 22 are each coupled to positive voltages, wherein the positive voltage applied to drain region 22 is at a lower potential than the positive voltage applied to gate region 16. When holes are present in floating body region 18, a high drain current results in a logic "1" reading. When holes are not present in floating body region 18, a low drain current results in a logic "0" reading.

As illustrated above, a conventional floating body memory cell stores charges within a floating body that is adjacent to the drain and source regions and, therefore, the stored charges have a tendency to leak out of the floating body during operation. Additionally, conventional floating body memory cells suffer from poor data retention due to charge lost from the floating body upon charge recombination at a source region during hold, read and write operations. Furthermore, because conventional floating body memory cells may have a small floating body, which is not configured to hold a substantial charge, any charge lost may result in a fluctuating or weakened signal.

There is a need for methods, devices, and systems for enhancing the functionality of floating body memory cells. Specifically, there is a need for methods, devices, and systems for increasing data retention of a floating body memory cell while decreasing disturbance of adjacent memory cells during writing and reading operations.

BRIEF DESCRIPTION OF THE DRAWINGS

FIGS. 5A and 5B respectively illustrate a plan view and a cross-sectional view of a formation of a structure, in accordance with an embodiment of the present invention;

FIG. 6A is a plan view of further formation of the structure of FIG. 5A, in accordance with an embodiment of the present invention;

FIG. 6B is a cross-sectional view of further formation of the structure of FIG. 5B, in accordance with an embodiment of the present invention;

FIG. 9A is a plan view of further formation of the structure of FIG. 8A, in accordance with an embodiment of the present invention;

FIG. 9B is a cross-sectional view of further formation of the structure of FIG. 8B, in accordance with an embodiment of the present invention;

FIG. 10A is a plan view of further formation of the structure of FIG. 9A, in accordance with an embodiment of the present invention;

FIG. 10B is a cross-sectional view of further formation of the structure of FIG. 9B, in accordance with an embodiment of the present invention;

FIG. 13A is a plan view of further formation of the structure of FIG. 12A, in accordance with an embodiment of the present invention;

FIG. 13B is a cross-sectional view of further formation of the structure of FIG. 12B, in accordance with an embodiment of the present invention;

FIG. 14 is a cross-sectional view of further formation of the structure of FIG. 13B, in accordance with an embodiment of the present invention;

FIG. 23A is a plan view of further formation of the structure of FIG. 22A, in accordance with an embodiment of the present invention;

FIG. 23B is a cross-sectional view of further formation of the structure of FIG. 22B, in accordance with an embodiment of the present invention;

FIG. 24A is a plan view of further formation of the structure of FIG. 23A, in accordance with an embodiment of the present invention;

FIG. 24B is a cross-sectional view of further formation of the structure of FIG. 23B, in accordance with an embodiment of the present invention;

FIG. 29 is a cross-sectional view of a portion of a memory array including a plurality of memory cells, according to another embodiment of the present invention; and FIG. 30 is a cross-sectional view of a portion of a memory array including a plurality of memory cells, in accordance with yet another embodiment of the present invention.

DETAILED DESCRIPTION

Figure 1:
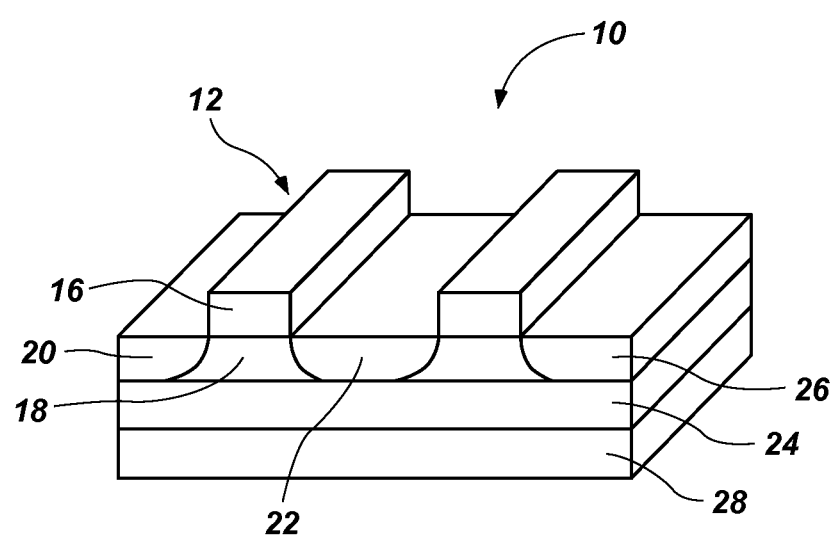
FIG. 1 illustrates a conventional floating body memory cell.

In the following detailed description, reference is made to the accompanying drawings which form a part hereof and, in which is shown by way of illustration, specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the disclosure.

In this description, functions may be shown in block diagram form in order not to obscure the present invention in unnecessary detail. Furthermore, specific implementations shown and described are only examples and should not be construed as the only way to implement the present invention unless specified otherwise herein. Block definitions and partitioning of logic between various blocks represent a specific implementation. It will be readily apparent to one of ordinary skill in the art that the various embodiments of the present invention may be practiced by numerous other partitioning solutions. For the most part, details concerning timing considerations, and the like, have been omitted where such details are not necessary to obtain a complete understanding of the present invention in its various embodiments and are within the abilities of persons of ordinary skill in the relevant art.

The terms "wafer" and "substrate" used in the following description include any structure having an exposed surface, on or in which an integrated circuit (IC) structure relating to embodiments of the present invention may be formed. The term substrate includes, without limitation, semiconductor wafers and other bulk semiconductor substrates. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures known to one skilled in the art. The term "conductor" includes semiconductors, and the term "insulator" or "dielectric" includes any material that is less electrically conductive than the materials referred to herein as conductors.

Referring in general to the following description and accompanying drawings, various aspects of the present invention are illustrated to show its structure and method of operation. Common elements of the illustrated embodiments are designated with like numerals. It should be understood the figures presented are not meant to be illustrative of actual views of any particular portion of the actual structure or method, but are merely idealized representations which are employed to more clearly and fully depict the present invention.

A memory cell including a floating body and a memory array including a plurality of memory cells, according to various embodiments of the present invention, will first be described with reference to FIGS. 2-4. Methods of forming a memory array including a plurality of memory cells, in accordance with various embodiments of the present invention, will then be described with reference to FIGS. 5A-25. Read and write operations of a memory cell, in accordance with one or more embodiments of the present invention, will then be described with reference to FIG. 26. Thereafter, with reference to FIGS. 27 and 28, an electronic system and a semiconductor wafer, each incorporating a memory array and memory cells of one or more of the previous embodiments will be described.

It should be noted that although the following described embodiments of the present invention comprise one or more NMOS transistors, other transistors known by one of ordinary skill, such as PMOS transistors, may be used in carrying out various embodiments of the present invention. Furthermore, although the following described embodiments of the present invention refer to "hole generation" or "holes" acting as majority carriers, it will be understood by a person of ordinary skill in the art that various voltages and/or doping polarities can be reversed in specific embodiments, providing, for example, electron generation and electrons acting as majority carriers.

Figure 2:
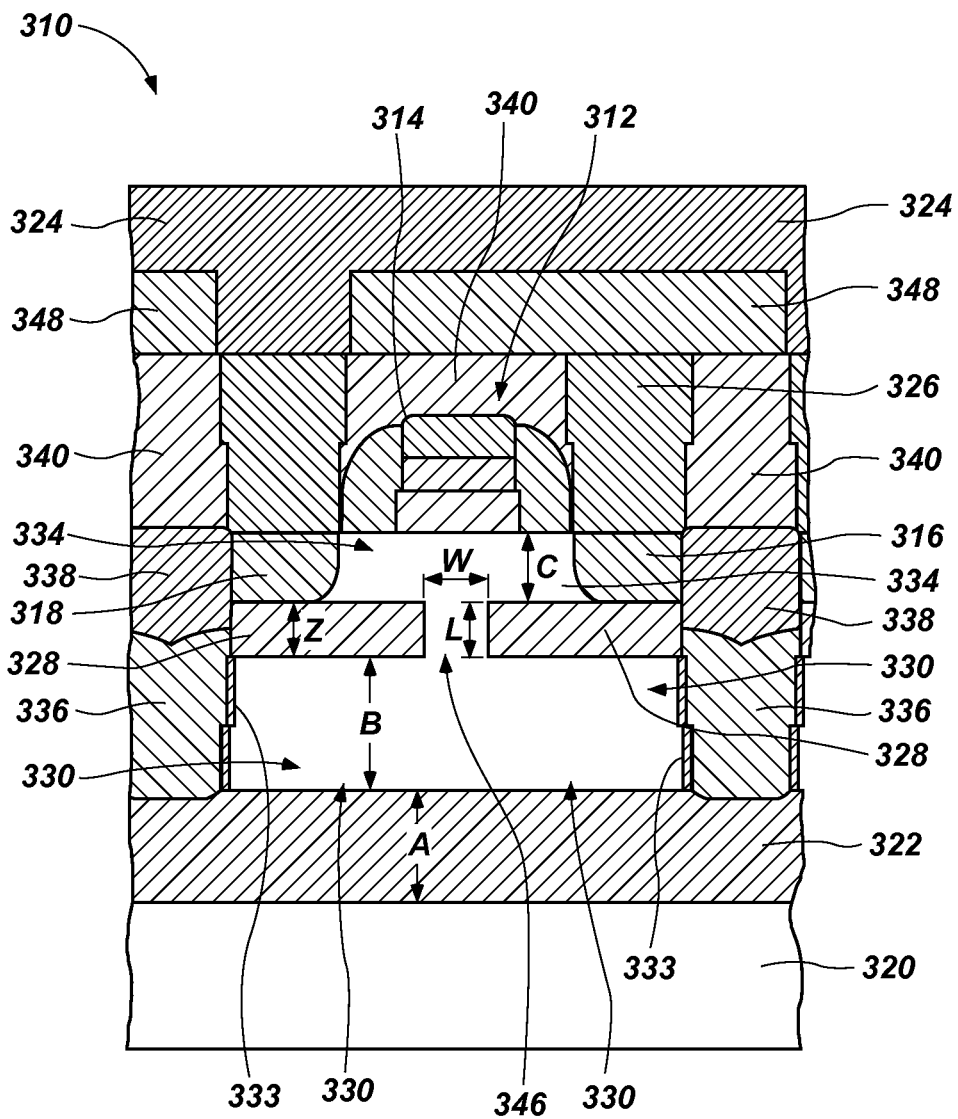
FIG. 2 is a cross-sectional view of a memory cell, in accordance with an embodiment of the present invention.

FIG. 2 is a cross-sectional view of a memory cell 310 including a floating body, in accordance with an embodiment of the present invention. As illustrated in FIG. 2, memory cell 310 includes a transistor 312 having a gate region 314, a source region 316, and a drain region 318. Transistor 312 may be formed over a buried insulator 322, which may overlie a substrate 320. For example only, and not by way of limitation, buried insulator 322 may comprise a buried oxide (BOX) layer and substrate 320 may comprise a bulk silicon substrate. Memory cell 310 may also include a common source line 326 operably coupled to source region 316. Furthermore, memory cell 310 includes a digit line 324 overlying an oxide layer 348 and extending through a channel in oxide layer 348 to operably couple to drain region 318.

Additionally, memory cell 310 includes a first region 334 which may comprise silicon. According to some embodiments, first region 334 may comprise epitaxial (EPI) silicon and, more specifically, positively doped EPI silicon. First region 334 overlies a second region 330 which may comprise silicon. According to some embodiments, second region 330 may comprise positively doped silicon. Second region 330 may also be referred to hereinafter as a "charge storing region." First region 334 may be coupled to second region 330 via a passage 346 formed through a buried oxide layer 328, which may comprise, for example, a buried oxide (BOX). Passage 346 may comprise silicon, and in some embodiments may comprise epitaxial (EPI) silicon. Furthermore, according to some embodiments, passage 346 may be positively doped and, according to other embodiments, passage 346 may be negatively doped. Additionally, memory cell 310 may comprise a dielectric layer 333 formed adjacent each outer vertical surface of second region 330 and extending from a top surface of second region 330 to a bottom surface of second region 330. Second region 330, passage 346, and first region 334 collectively may define a floating body of memory cell 310.

Furthermore, memory cell 310 includes a conductive element 336 adjacent each outer vertical surface of second region 330 and extending from above a top surface of second region 330 to a bottom surface of second region 330. Conductive element 336 may have an oxide region 338 formed thereover. For example only, and not by way of limitation, conductive element 336 may comprise polysilicon or any metal. For ease of description, conductive element 336 will hereinafter be referred to as bias gate 336. Memory cell 310 may also include an oxide region 340 overlying oxide region 338 and gate region 314.

As described more fully below, during a contemplated operation of memory cell 310, bias gate 336 may be operably coupled to a bias voltage and, more specifically, a negative bias voltage. Therefore, second region 330 in conjunction with dielectric layer 333 and bias gate 336, which at least partially surrounds second region 330, may function as a capacitor. As a result, holes generated within the floating body (i.e., first region 334, passage 346, and second region 330) during operation may be stored within second region 330. Consequently, during operation of memory cell 310, charges may be stored remote from each of source region 316 and drain region 318 and, therefore, charge recombination may be decreased relative to conventional floating body memory cells. Furthermore, coupling second region 330 to first region 334 via passage 346 may restrict the number of charges moving into or moving out of second region 330 during operation of memory cell 310. As a result, charge retention may be enhanced compared to conventional floating body memory cells. Moreover, as configured, memory cell 310 may include a floating body having a larger storage area in comparison to a floating body of a conventional prior art structure. Consequently, this may allow for more charge to be stored and, therefore, minimize the signal fluctuation due to any lost charge. As a result, memory cell 310 may provide an enhanced signal in comparison to conventional structures.

As mentioned above, bias gate 336 may comprise a conductor and, as understood by one of ordinary skill in the art, conductors (e.g., polysilicon or metal) may exhibit a "work function." Utilizing bias gate 336 with a conductor having a lower "work function" (e.g., 4.0) in comparison to a conductor having a higher "work function" (e.g., 5.1) may increase the capacitance of second region 330. Moreover, the capacitance of second region 330 may also be increased by increasing a vertical thickness B of second region 330. Furthermore, to increase the capacitance of second region 330, dielectric layer 333 may comprise a high-K dielectric material in comparison to silicon dioxide, dielectric layer 333 may be thinned, or any combination thereof.

Additionally, to further reduce the charge lost during operation of memory cell 310, passage 346 may be negatively doped to increase the resistance of passage 346 and further restrict the movement of charges into and out of second region 330. Furthermore, to restrict the movement of charges into and out of second region 330, the resistance of passage 346 may be increased by increasing vertical length L of passage 346, decreasing a width W of passage 346, or a combination thereof. Moreover, first region 334 may be undoped or lightly positively doped relative to the doping concentration of second region 330 to decrease the number of positive charges positioned near source region 316 or drain region 318 during operation of memory cell 310. As a result, charge recombination may be decreased and, therefore, an amount of charge lost during operation may also be decreased.

It should be noted that depending on the configuration of passage 346 (e.g., the width W of passage 346, the vertical length L of passage 346, or the doping of passage 346), erasing a charge (i.e., writing a logic "0") from memory cell 310 may prove to be difficult due to the restriction of charges moving out of second region 330 and through passage 346. In this case, bias gate 336 may be coupled to either a positive voltage or 0.0 volts in order to more easily erase a charge stored within second region 330. Furthermore, passage 346 may be lightly positively doped (e.g., 1e15/cm3) to decrease the resistance of passage 346 and lessen the restriction of charge movement into and out of second region 330.

Figure 3:
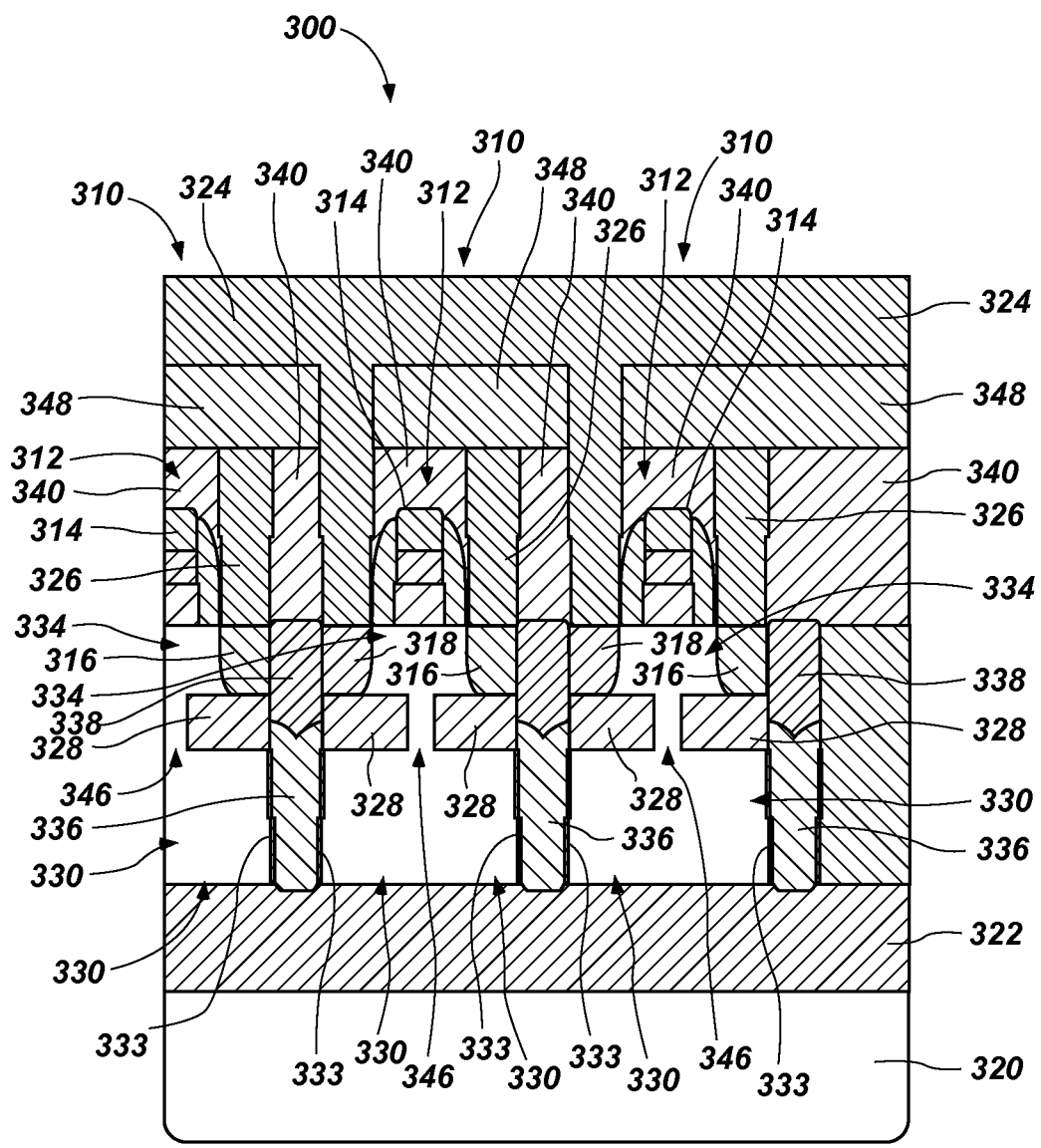
FIG. 3 is a cross-sectional view of a portion of a memory array including a plurality of memory cells, according to an embodiment of the present invention.
Figure 4:
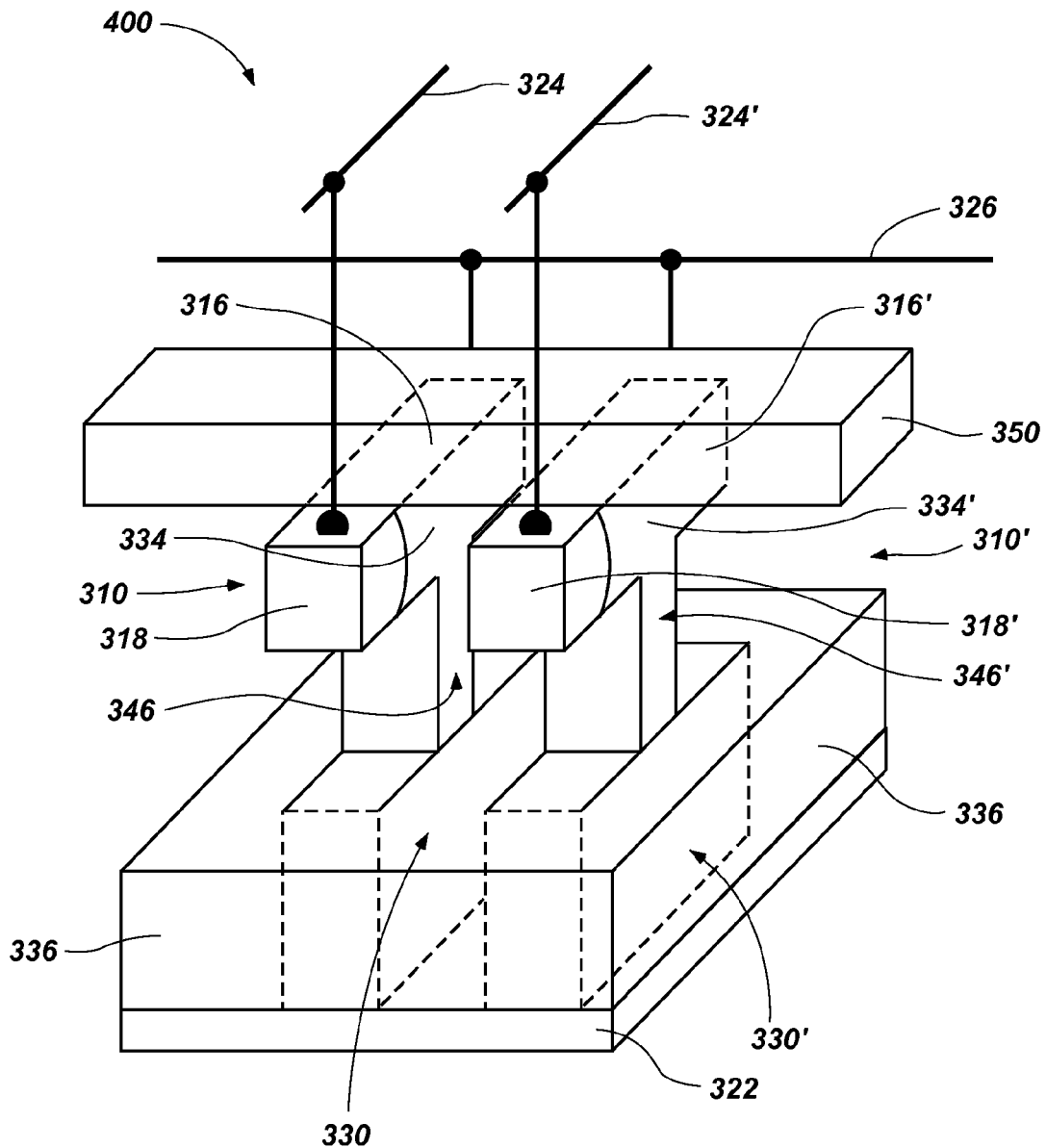
FIG. 4 illustrates a three-dimensional view of a portion of a memory array including a plurality of memory cells, in accordance with an embodiment of the present invention.
Figure 7B:
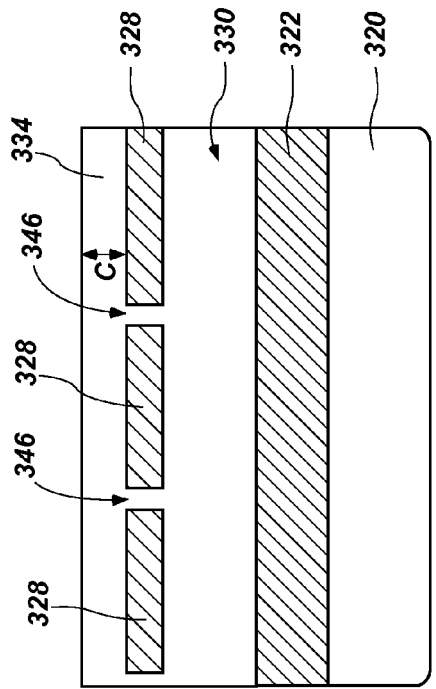
FIG. 7B is a cross-sectional view of further formation of the structure of FIG. 6B, in accordance with an embodiment of the present invention.

FIG. 3 is a cross-sectional view of a portion of a memory array 300 including a plurality of memory cells 310, according to an embodiment of the present invention. Like numerals have been used to identify like features in FIGS. 2 and 3. FIG. 4 illustrates a three-dimensional view of a portion of a memory array 400 including memory cells 310 and 310', in accordance with an embodiment of the present invention. As illustrated in FIG. 4, adjacent memory cells 310 and 310' include respective drain regions 318 and 318' and respective source regions 316 and 316'. Drain regions 318 and 318' are operably coupled to respective digit lines 324 and 324' and source regions 316 and 316' are each operably coupled to common source line 326. Additionally, a gate region (not shown; see e.g., gate region 314 shown in FIGS. 2 and 3) of each memory cell 310 and 310' is operably coupled to a word line 350. Furthermore, memory cells 310 and 310' include respective first regions 334 and 334', second regions 330 and 330', and passages 346 and 346'. As illustrated, first region 334 may be coupled to second region 330 via passage 346 formed through buried oxide layer 328 (not shown; see FIGS. 2 and 3). Moreover, first region 334' may be coupled to second region 330' via passage 346' formed through buried oxide layer 328 (see FIGS. 3 and 4). Furthermore, bias gate 336, which overlies buried insulator 322, may at least partially surround second regions 330 and 330'.

With reference to FIGS. 5A-18, a method of forming a memory array including a plurality of memory cells according to various embodiments of the present invention will now be described. In one embodiment as depicted in the plan view illustrated in FIG. 5A and the cross-sectional view illustrated in FIG. 5B, a structure including buried insulator 322 formed over substrate 320 may be provided. As mentioned above, buried insulator 322 may comprise, for example only, a buried oxide (BOX) layer, and substrate 320 may comprise, for example only, a bulk silicon substrate. Moreover, for example only, buried insulator 322 may have a vertical thickness A in a range of substantially 50 to 500 nanometers. Furthermore, the structure may include oxide layer 328 comprising, for example only, silicon dioxide overlying second region 330 which, as mentioned above, may comprise silicon. Furthermore, second region 330 overlies buried insulator 322. Second region 330 may have a vertical thickness B in a range of, for example only, substantially 50 to 200 nanometers. Oxide layer 328 may be formed by any known deposition or oxidation process and may have a vertical thickness Z in a range of, for example only, substantially 50 to 150 nanometers.

With reference to the plan view illustrated in FIG. 6A and the cross-sectional view illustrated in FIG. 6B, a plurality of passages 346 may be etched into and through an entire depth of oxide layer 328. Passages 346 may have a width W (see FIG. 2) in a range of, for example only, substantially 5 to 20 nanometers. Additionally, passage 346 may have a length L (see FIG. 2) in a range of, for example only, substantially 50 to 150 nanometers. For example only, passages 346 may be etched through oxide layer 328 using a reactive ion etching (RIE) process or any other suitable etching process known by one having ordinary skill in the art. Thereafter, as depicted in the plan view illustrated in FIG. 7A and the cross-sectional view illustrated in FIG. 7B, first region 334 may be formed over oxide layer 328 and into each passage 346. First region 334 may be formed by any known, suitable EPI process. For example only, first region 334 may be formed by a selective-EPI-growth process, an EPI-lateral-growth process, or any combination thereof. Furthermore, for example only, and not by way of limitation, first region 334 may have a vertical thickness C in a range of substantially 30 to 100 nanometers.

Figure 8B:
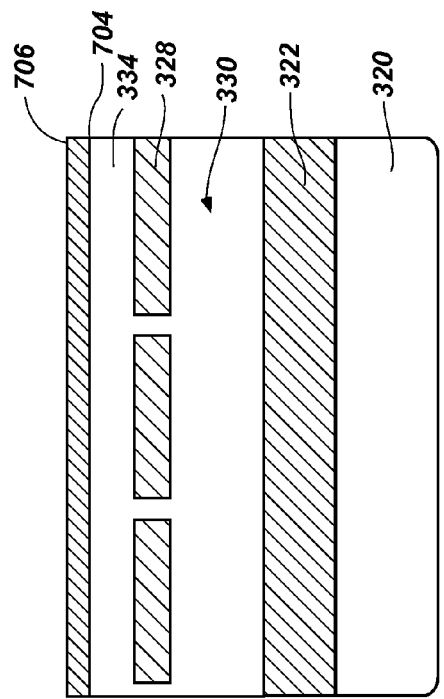
FIG. 8B is a cross-sectional view of further formation of the structure of FIG. 7B, in accordance with an embodiment of the present invention.
Figure 7A:
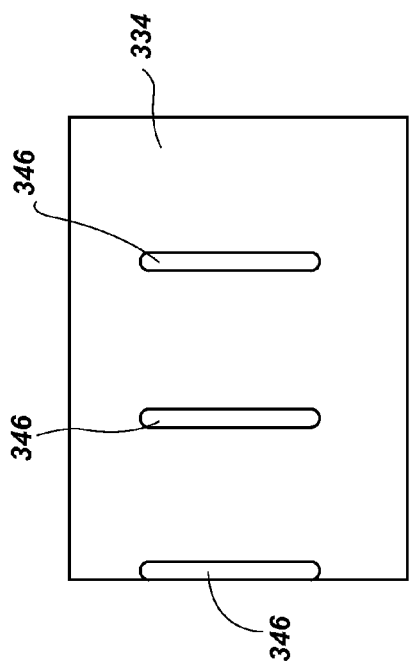
FIG. 7A is a plan view of further formation of the structure of FIG. 6A, in accordance with an embodiment of the present invention.
Figure 8A:
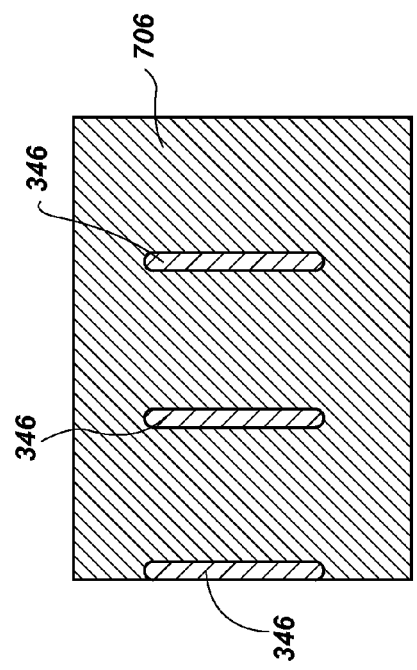
FIG. 8A is a plan view of further formation of the structure of FIG. 7A, in accordance with an embodiment of the present invention.

A sacrificial oxide layer 704 may then be formed over first region 334 and a sacrificial nitride layer 706 may be formed over sacrificial oxide layer 704, as depicted in the plan view illustrated in FIG. 8A and the cross-section view illustrated in FIG. 8B. For example only, and not by way of limitation, sacrificial oxide layer 704 may have a vertical thickness in a range of substantially 5 to 10 nanometers and sacrificial nitride layer 706 may have a vertical thickness in a range of substantially 20 to 50 nanometers.

FIGS. 9A and 9B respectively illustrate a plan view and a cross-sectional view of the structures depicted in FIGS. 8A and 8B after further processing in which sacrificial nitride layer 706, sacrificial oxide layer 704, first region 334, oxide layer 328, and second region 330 have been etched therethrough to form shallow trench isolation (STI) regions 708. Shallow trench isolation (STI) regions 708 may be formed by any process known by one having ordinary skill in the art. Furthermore, as illustrated in FIG. 9B, dielectric layers 333 may be formed adjacent each outer vertical surface of second region 330, wherein each dielectric layer 333 extends from a top surface of second region 330 to a bottom surface of second region 330. For example, dielectric layers 333 may be formed by selectively oxidizing each outer vertical surface of second region 330.

Thereafter, as depicted in the plan view illustrated in FIG. 10A and the cross-sectional view illustrated in FIG. 10B, bias gate 336 may be formed over sacrificial oxide layer 704 and within STI regions 708. As mentioned above, bias gate 336 may comprise, for example, polysilicon or a metal such as titanium nitride (TiN), tantalum nitride (TaN), any combination thereof, or any other metal. With reference to the plan view illustrated in FIG. 11A and the cross-sectional view illustrated in FIG. 11B, a portion of bias gate 336 overlying sacrificial oxide layer 704 and a portion within STI regions 708 may then be etched by any process known by one of ordinary skill in the art to form recessions 335. For example only, recessions 335 may be formed by a blanket RIE process, as understood by one having ordinary skill in the art. It should be noted that, as illustrated in FIG. 11B, bias gate 336 is etched within STI regions 708 to at least a depth below first region 334 but above a depth of second region 330.

Figure 11B:
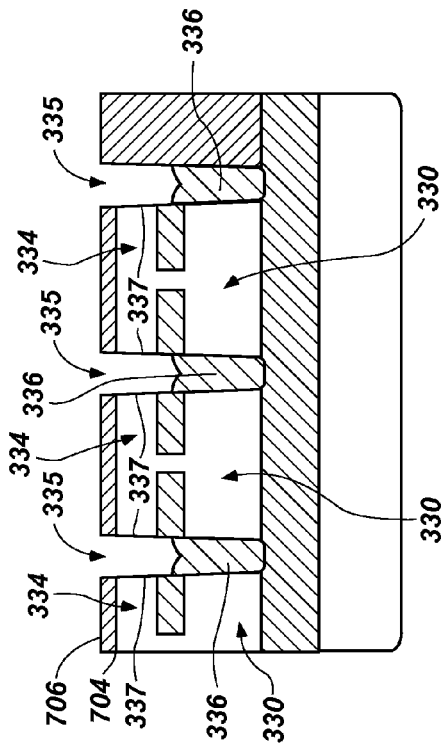
FIG. 11B is a cross-sectional view of further formation of the structure of FIG. 10B, in accordance with an embodiment of the present invention.
Figure 12B:
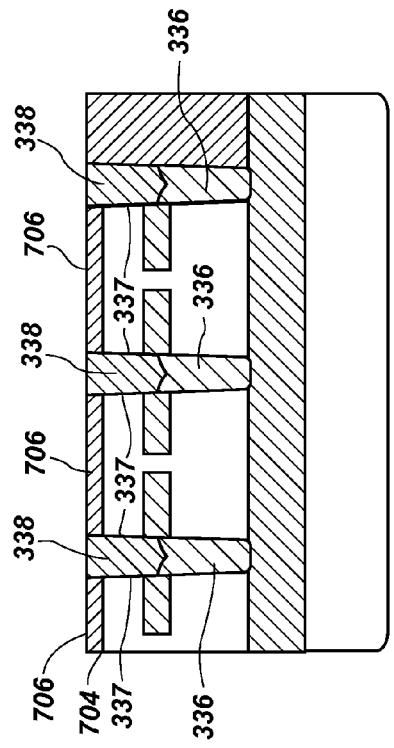
FIG. 12B is a cross-sectional view of further formation of the structure of FIG. 11B, in accordance with an embodiment of the present invention.
Figure 11A:
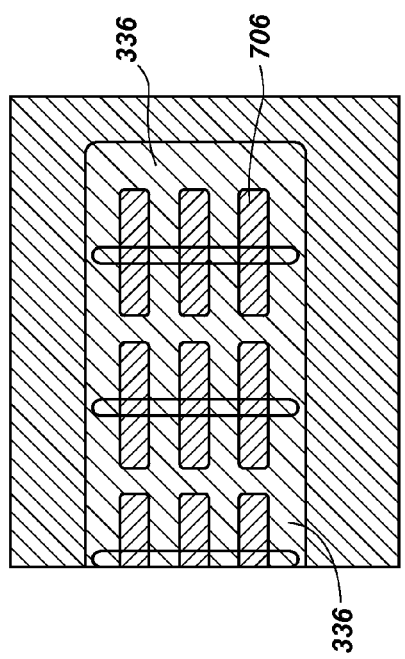
FIG. 11A is a plan view of further formation of the structure of FIG. 10A, in accordance with an embodiment of the present invention.
Figure 12A:
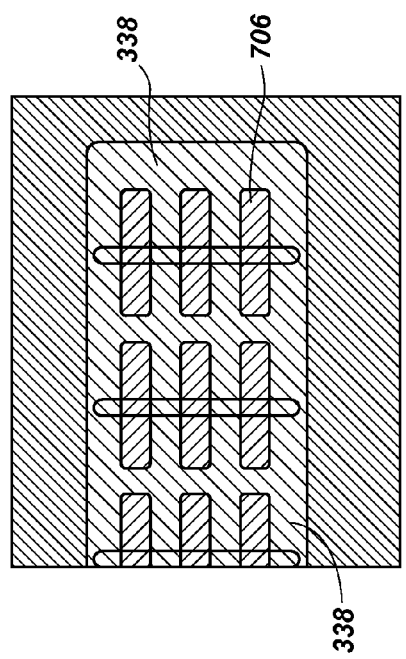
FIG. 12A is a plan view of further formation of the structure of FIG. 11A, in accordance with an embodiment of the present invention.
Figure 15:
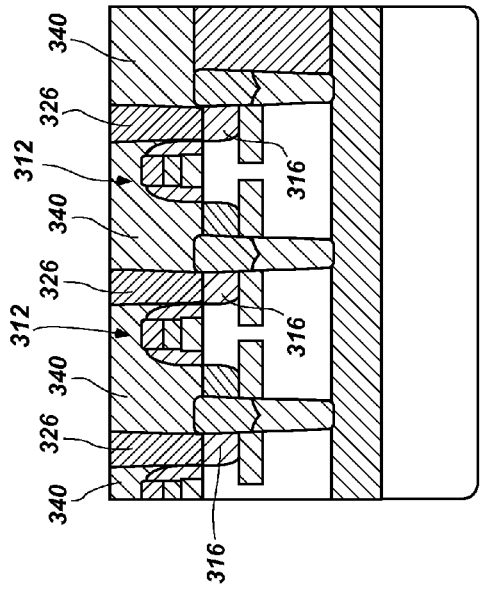
FIG. 15 is a cross-sectional view of further formation of the structure of FIG. 14, in accordance with an embodiment of the present invention.
Figure 16:
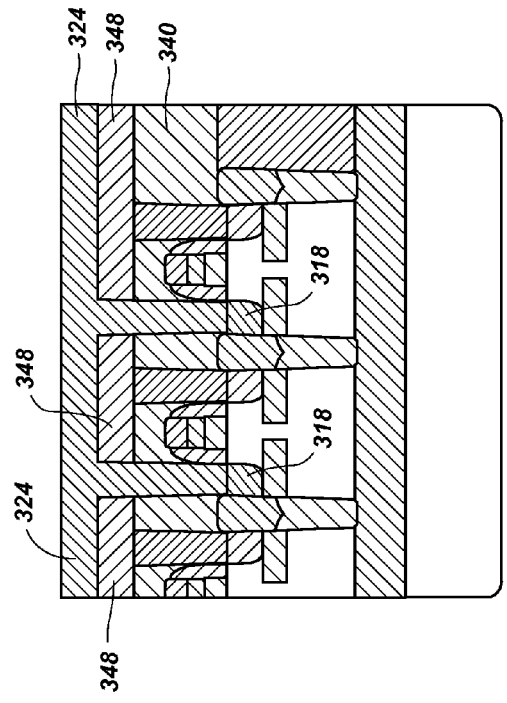
FIG. 16 is a cross-sectional view of further formation of the structure of FIG. 15, in accordance with an embodiment of the present invention.
Figure 17:
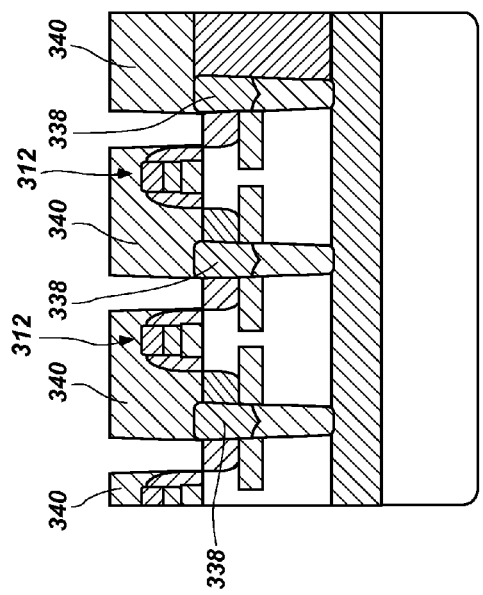
FIG. 17 is a cross-sectional view of further formation of the structure of FIG. 16, in accordance with an embodiment of the present invention.

Furthermore, as illustrated in FIG. 11B, dielectric layers 337 may be formed adjacent each outer vertical surface of first region 334, wherein each dielectric layer 337 extends from a top surface of first region 334 to a bottom surface of first region 334. For example, dielectric layers 337 may be formed by selectively oxidizing each outer vertical surface of first region 334. Subsequently, as depicted in the plan view illustrated in FIG. 12A and the cross-sectional view illustrated in FIG. 12B, oxide region 338 may be formed, by any known process, within STI regions 708 and over bias gate 336. A top layer of oxide region 338 may then be planarized by an abrasive process such as chemical-mechanical planarization (CMP). Each of sacrificial nitride layer 706 and sacrificial oxide layer 704 may then be removed resulting in the structure depicted in the plan view illustrated in FIG. 13A and the cross-sectional view illustrated in FIG. 13B. For example, sacrificial nitride layer 706 and sacrificial oxide layer 704 may be removed by selective RIE, an $H_3PO_4$ etchant, or any other process known by one of ordinary skill in the art.

Figure 18:
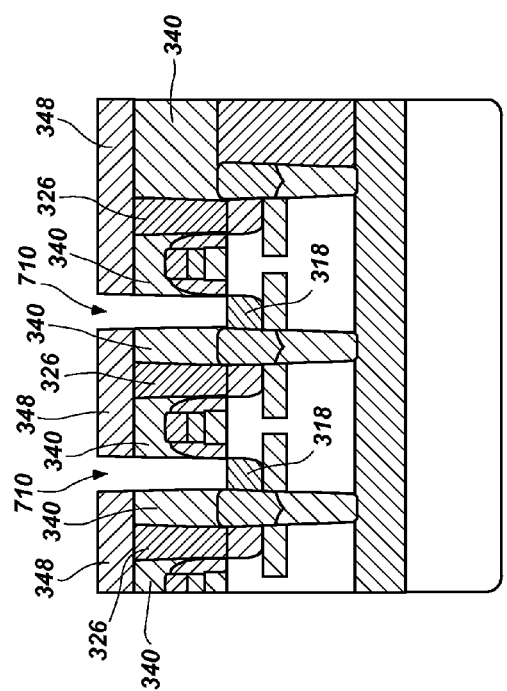
FIG. 18 is a cross-sectional view of further formation of the structure of FIG. 17, in accordance with an embodiment of the present invention.
Figure 19B:
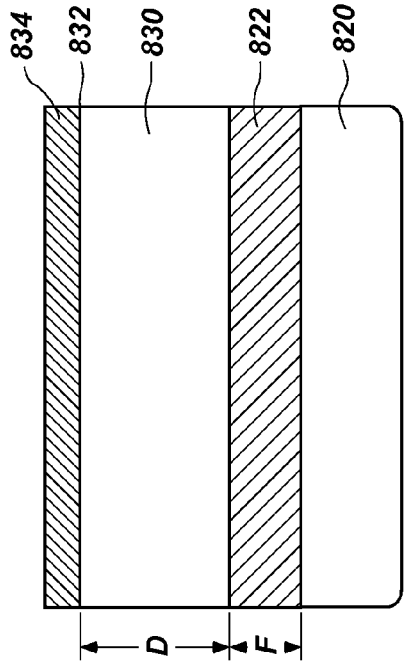
FIGS. 19A and 19B respectively illustrate a plan view and a cross-sectional view of a formation of a structure, in accordance with another embodiment of the present invention.

FIG. 14 illustrates the structure depicted in FIG. 13B after further processing in which dielectric layers 319 and transistors 312, each having a gate region 314, a drain region 318, and a source region 316, have been formed by conventional processes. Furthermore, with reference to the cross-sectional illustrations depicted in FIGS. 15 and 16, using any known process, oxide region 340 may be formed over transistors 312 and oxide region 338. Subsequently, a conventional damascene process may be used to create common source lines 326 extending through oxide region 340 and coupled to source regions 316. A top layer of common source lines 326 may then be planarized by an abrasive process such as a CMP process. For example only, common source lines 326 may comprise titanium (Ti), titanium nitride (TiN), tungsten (W), tantalum nitride (TaN), any combination thereof, or any other metal. Thereafter, with reference to FIG. 17, using any known process, oxide layer 348 may be formed over oxide region 340 and common source line 326. Subsequently, oxide layer 348 and oxide region 340 may each be etched by any known etching process, such as, for example, an RIE process, to form depressions 710 within oxide layer 348 and oxide region 340 and over drain regions 318. Digit line 324 may then be formed over oxide layer 348 and within depressions 710, and coupled to drain regions 318, as illustrated in FIG. 18. For example only, digit line 324 may comprise titanium (Ti), titanium nitride (TiN), tungsten (W), tantalum nitride (TaN), any combination thereof, or any other metal.

With reference to FIGS. 19A-25, a method of forming a memory array including a plurality of memory cells according to another embodiment of the present invention will now be described. In the embodiment as depicted in the plan view illustrated in FIG. 19A and the cross-sectional view illustrated in FIG. 19B, a structure including a buried insulator 822 overlying a substrate 820 may be provided. For example only, and not by way of limitation, buried insulator 822 may comprise a buried oxide (BOX) layer and substrate 820 may comprise a bulk silicon substrate. Furthermore, the structure may include an oxide layer 832 such as, for example, silicon dioxide overlying a layer 830, which may comprise silicon. By way of example only, layer 830 may comprise single crystalline. Furthermore, layer 830 overlies buried insulator 822. For example only, oxide layer 832 may have a vertical thickness of substantially 50 angstroms. Layer 830 may have a vertical thickness D in a range of, for example only, substantially 1.5 to 3 kiloangstroms (KÅ). Additionally, a nitride layer 834 may be formed over oxide layer 832 and may, for example only, have a vertical thickness in a range of substantially 200 to 500 angstroms.

Figure 20B:
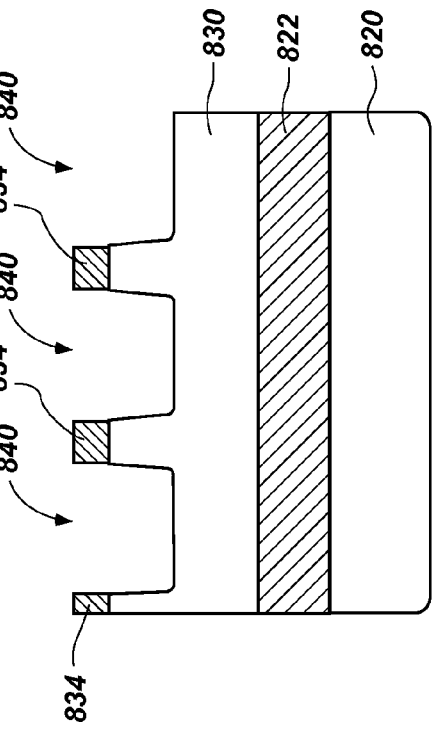
FIG. 20B is a cross-sectional view of further formation of the structure of FIG. 19B, in accordance with an embodiment of the present invention.
Figure 19A:
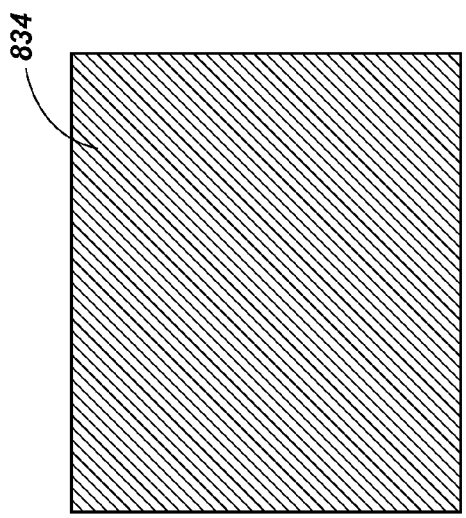
Figure 20A:
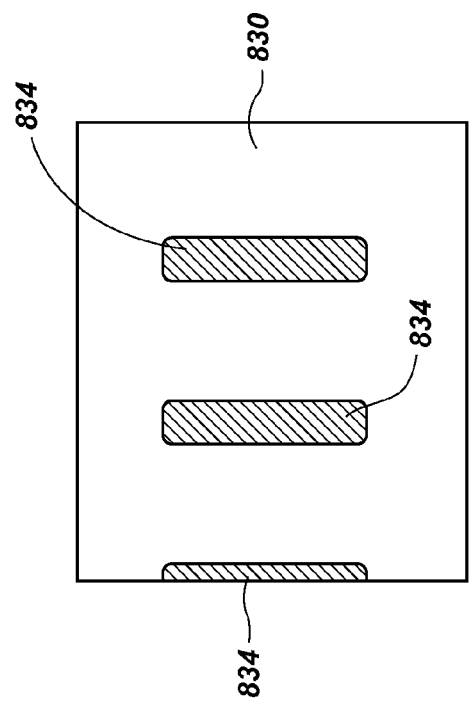
FIG. 20A is a plan view of further formation of the structure of FIG. 19A, in accordance with an embodiment of the present invention.
Figure 21A:
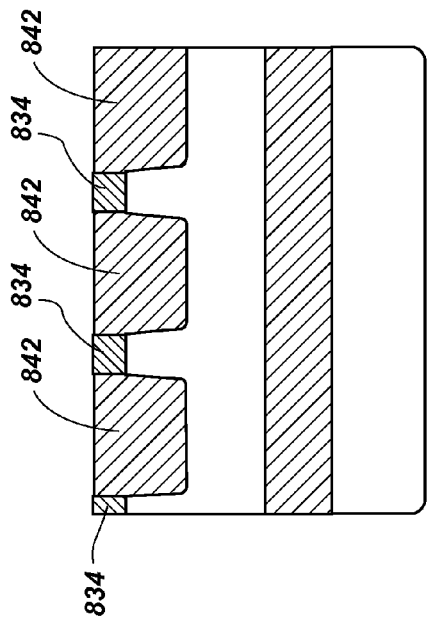
FIG. 21A is a plan view of further formation of the structure of FIG. 20A, in accordance with an embodiment of the present invention.
Figure 21B:
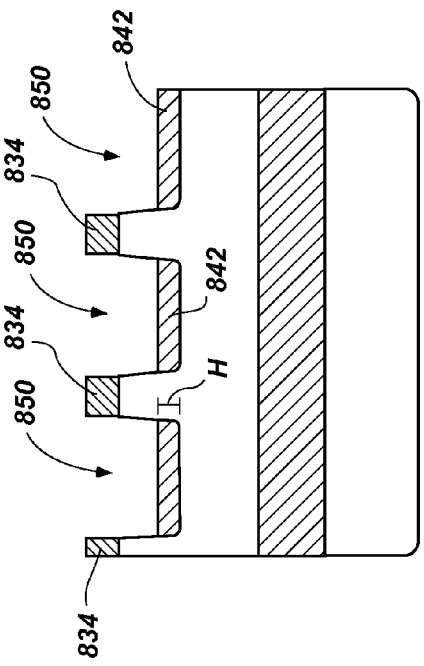
FIG. 21B is a cross-sectional view of further formation of the structure of FIG. 20B, in accordance with an embodiment of the present invention.

With reference to the plan view illustrated in FIG. 20A and the cross-sectional view illustrated in FIG. 20B, utilizing any known etching process, depressions 840 may be etched into and through nitride layer 834, oxide layer 832, and partially into layer 830. By way of example only, depressions 840 may be formed by a dry etching process, as understood by one of ordinary skill in the art. For example only, and not by way of limitation, depressions 840 may be etched into layer 830 a depth of substantially 1 kiloangstrom. Thereafter, with reference to the plan view illustrated in FIG. 21A and the cross-sectional view illustrated in FIG. 21B, each depression 840 may be filled with an oxide region 842, which may comprise, for example only, a spin-on dielectric (SOD). A top layer of each oxide region 842 may then be planarized by an abrasive process such as a CMP process. As depicted in the plan view illustrated in FIG. 22A and the cross-sectional view illustrated in FIG. 22B, a plurality of depressions 850 may then be formed into but not through each oxide region 842 using an etching process, such as, for example only, a dry etching process, a Dilute HydroFluoric (DHF) acid etching process, or any combination thereof. Subsequent to etching oxide regions 842, each oxide region 842 may have a vertical thickness H in a range of, for example only, substantially 200 to 500 angstroms.

Figure 22A:
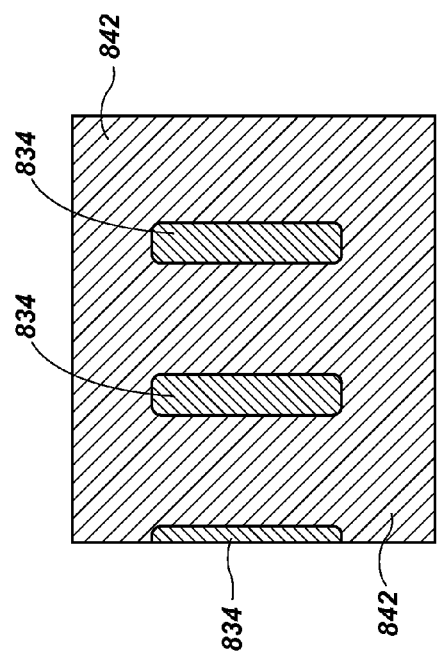
FIG. 22A is a plan view of further formation of the structure of FIG. 21A, in accordance with an embodiment of the present invention.
Figure 22B:
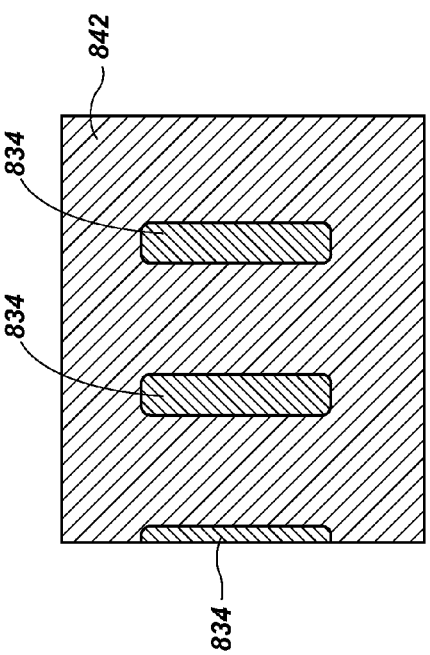
FIG. 22B is a cross-sectional view of further formation of the structure of FIG. 21B, in accordance with an embodiment of the present invention.
Figure 25:
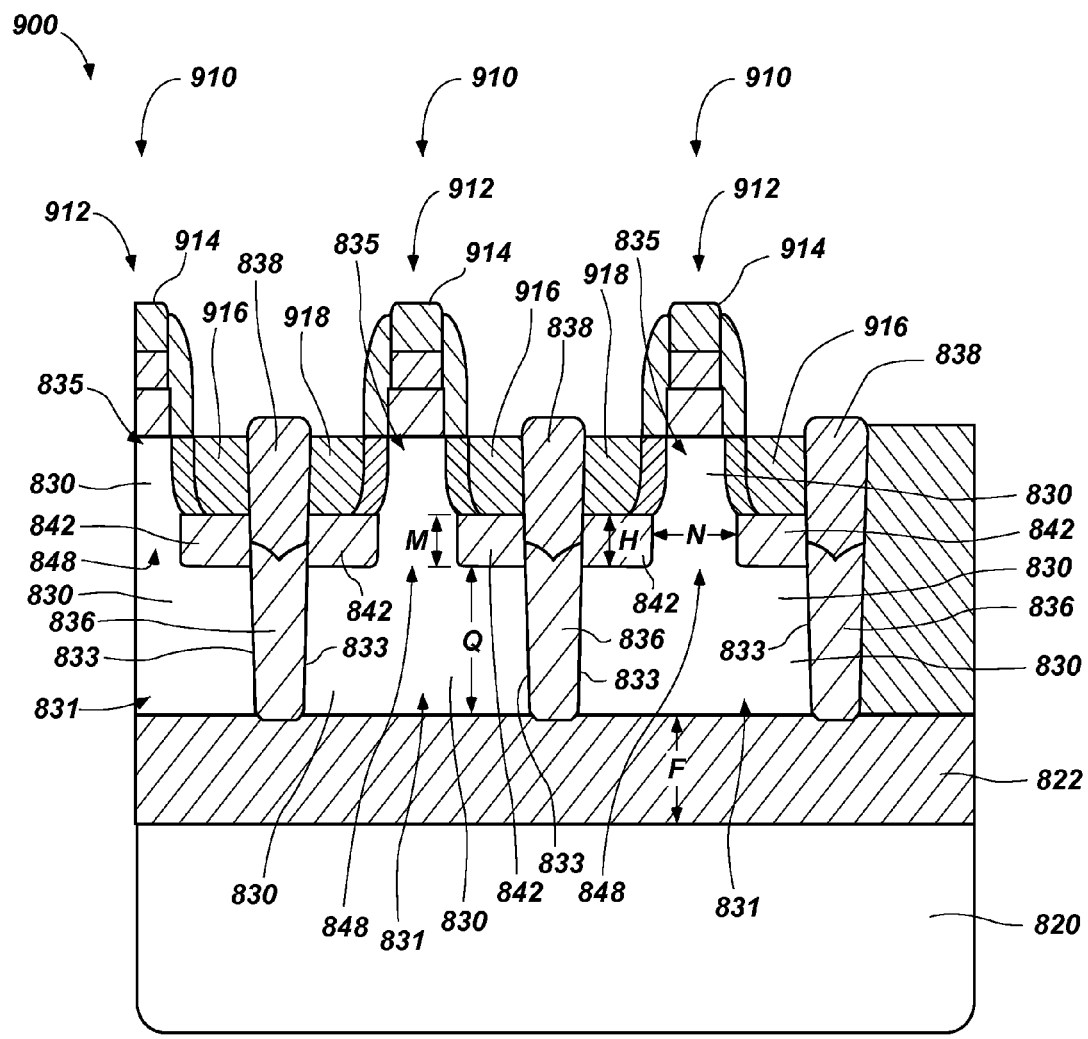
FIG. 25 is a cross-sectional view of further formation of the structure of FIG. 24B, in accordance with an embodiment of the present invention.

FIGS. 23A and 23B respectively illustrate the structure depicted in FIGS. 22A and 22B after further processing in which regions 846, each comprising silicon and, more specifically, EPI silicon, may be formed within depressions 850 (see FIGS. 22A and 22B). Furthermore, a top layer of each region 846 may then be planarized by an abrasive process such as a CMP process. Thereafter, as depicted in the plan view illustrated in FIG. 24A and the cross-sectional view illustrated in FIG. 24B, nitride layer 834 and oxide layer 832 may each be removed and the resultant exposed surface of layer 830 may be polished in order to smooth the exposed surface of layer 830. Thereafter, the method steps as described with reference to FIGS. 9A-18 may be followed to form a memory array 900 including a plurality of memory cells 910, as illustrated in FIG. 25. Forming the structure illustrated in FIGS. 24A and 24B with the steps illustrated in reference to FIGS. 19A-24B assures a uniform top surface of layer 830 without performing a planarization technique on layer 830.

Referring to FIG. 25, memory array 900 includes a plurality of memory cells 910, wherein each memory cell 910 includes a transistor 912 having a gate region 914, a source region 916, and a drain region 918. Transistors 912 may be disposed over buried insulator 822, which may overlie substrate 820. As mentioned above, buried insulator 822 may comprise, for example only, a buried oxide (BOX) layer and substrate 820 may comprise, for example only, a bulk silicon substrate.

Additionally, each memory cell 910 includes a first region 835 and a second region 831 within layer 830. Second region 831 may also be referred to hereinafter as a "charge storing region." According to some embodiments, first region 835 and second region 831 may each comprise positively doped silicon. According to other embodiments, first region 835 may comprise undoped silicon. First region 835 may be coupled to second region 831 via a passage 848 extending through oxide region 842, which may comprise, for example, a buried oxide (BOX). According to some embodiments, passage 848, which may comprise silicon, may be positively doped and, according to other embodiments, passage 848 may be negatively doped. Additionally, a dielectric layer 833 may be formed adjacent each outer vertical surface of second region 831 and extending from a top surface of second region 831 to a bottom surface of second region 831. Second region 831, passage 848, and first region 835 collectively may define a floating body of memory cell 910.

Furthermore, memory array 900 includes a conductive element 836 formed adjacent each outer vertical surface of second region 831 and extending from above a top surface of second region 831 to a bottom surface of second region 831. In addition, conductive element 836 has an oxide region 838 formed thereover. For example only, and not by way of limitation, conductive element 836 may comprise polysilicon or any metal. For ease of description, conductive element 836 will hereinafter be referred to as bias gate 836.

As described more fully below, during a contemplated operation of memory cell 910, bias gate 836 may be operably coupled to a bias voltage and, more specifically, a negative bias voltage. Therefore, second region 831 in conjunction with dielectric layers 833 and bias gate 836, which at least partially surrounds second region 831, may function as a capacitor. As a result, holes generated within the floating body (i.e., first region 835, passage 848, and second region 831) during operation may be stored within second region 831. Consequently, during operation of memory cell 910, charges may be stored remote from each of source region 916 and drain region 918 and, therefore, charge recombination may be decreased relative to conventional floating body memory cells. Furthermore, coupling second region 831 to first region 835 via passage 848 may restrict the number of charges moving into or moving out of second region 831 during operation of memory cell 910. As a result, charge retention may be enhanced compared to conventional floating body memory cells. Moreover, as configured, memory cell 910 may include a floating body having a larger storage area than a floating body of a conventional prior art structure. Consequently, this may allow for more charge to be stored and, therefore, minimize the signal fluctuation due to any lost charge. As a result, memory cell 910 may provide an enhanced signal in comparison to conventional structures.

As mentioned above, bias gate 836 may comprise a conductor and, as understood by one of ordinary skill in the art, conductors (e.g., polysilicon or metal) may exhibit a "work function." Utilizing bias gate 836 with a conductor having a lower "work function" (e.g., 4.0) in comparison to a conductor having a higher "work function" (e.g., 5.1) may increase the capacitance of second region 831. Moreover, the capacitance of second region 831 may also be increased by increasing a thickness Q of second region 831. Furthermore, to increase the capacitance of second region 831, dielectric layer 833 may comprise a high-K dielectric material in comparison to silicon dioxide, dielectric layer 833 may be thinned, or any combination thereof.

Additionally, to further reduce the charge lost during operation of memory cell 910, passage 848 may be negatively doped to increase the resistance of passage 848 and further restrict the movement of charges into and out of second region 831. Furthermore, to further restrict the movement of charges into and out of second region 831, the resistance of passage 848 may be increased by increasing a length M of passage 848, decreasing a width N of passage 848, or a combination thereof. Moreover, first region 835 may be undoped or lightly positively doped relative to the doping concentration of second region 831 to decrease the number of positive charges positioned near source region 916 or drain region 918 during an operation of memory cell 910. As a result, charge recombination may be decreased and, therefore, an amount of charge lost during operation may also be decreased.

It should be noted that, depending on the configuration of passage 848 (e.g., the width N of passage 848, the length M of passage 848, or the doping of passage 848), erasing a charge (i.e., writing a logic "0") from memory cell 910 may prove to be difficult due to the restriction of charges moving out of second region 831 and through passage 848. In this case, bias gate 836 may be coupled to either a positive voltage or 0.0 volts in order to more easily erase a charge stored within second region 831. Furthermore, passage 848 may be lightly positively doped (e.g., 1e15/cm$^3$) to decrease the resistance of passage 848 and lessen the restriction of charge movement into and out of second region 831.

It should also be noted that, although the above described embodiments comprise one or more planar transistors, other transistors known by one of ordinary skill, such as recessed channel transistors, or finFETs may be used in carrying out various embodiments of the present invention. For example, as illustrated in FIG. 29, memory array 779 includes a plurality of memory cells 760, wherein each memory cell 760 includes a finFET transistor 762 having a gate region 769, as will be appreciated by one of ordinary skill in the art. As understood by a person having ordinary skill in the art, a finFET transistor may include a gate region which may be formed into at least a portion of a silicon structure configured to act as a floating body of a memory cell. As a result, the gate region may at least partially wrap around one or more portions of the floating body. As illustrated in FIG. 29, each memory cell 760 includes a first region 764 and a second region 765 within layer 766. Second region 765 may also be referred to hereinafter as a "charge storing region." According to some embodiments, first region 764 and second region 765 may each comprise positively doped silicon. According to other embodiments, first region 764 may comprise undoped silicon. First region 764 may be coupled to second region 765 via a passage 768 extending through oxide region 767, which may comprise, for example, a buried oxide (BOX). According to some embodiments, passage 768, which may comprise silicon, may be positively doped and, according to other embodiments, passage 768 may be negatively doped.

Furthermore, for example, as illustrated in FIG. 30, memory array 789 includes a plurality of memory cells 780, wherein each memory cell 780 includes a recessed channel transistor 782 having a gate region 799, as will be appreciated by one of ordinary skill in the art. As illustrated in FIG. 30, each memory cell 780 includes a first region 784 and a second region 785 within layer 786. Second region 785 may also be referred to hereinafter as a "charge storing region." According to some embodiments, first region 784 and second region 785 may each comprise positively doped silicon. According to other embodiments, first region 784 may comprise undoped silicon. First region 784 may be coupled to second region 785 via a passage 788 extending through oxide region 787, which may comprise, for example, a buried oxide (BOX). According to some embodiments, passage 788, which may comprise silicon, may be positively doped and, according to other embodiments, passage 788 may be negatively doped.

Figure 26:
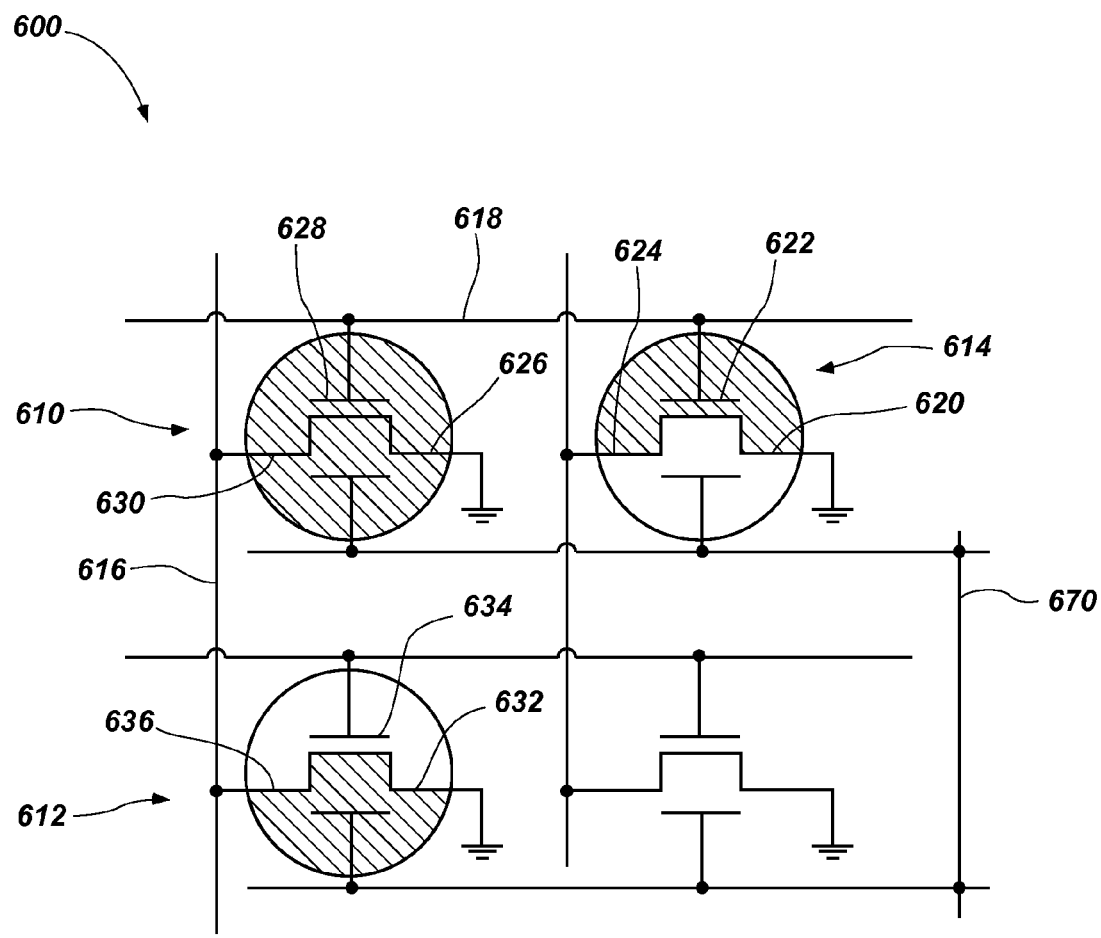
FIG. 26 is a circuit diagram of a memory array including a plurality of memory cells, in accordance with an embodiment of the present invention.

With reference to FIG. 26 various operations (i.e., reading, erasing, or writing) of a memory cell will now be described. FIG. 26 illustrates a circuit diagram of a memory array 600 including a memory cell 610 to be programmed and adjacent memory cells 612 and 614. Memory cells 610, 612, and 614 may each comprise previously described memory cells 310 or 910. As illustrated, each memory cell 610, 612, and 614 includes a transistor having a gate, a drain, and a source, as identified below. Furthermore, each memory cell 610, 612, and 614 includes a bias gate 670, which may comprise previously described bias gates 336 or 836. As illustrated, memory cell 610 shares a digit line 616 with memory cell 612 and shares a word line 618 with memory cell 614. Furthermore, it should be noted that during the following described operations, bias gate 670 is operably coupled to a bias voltage, such as a negative bias voltage (e.g., −1.5 volt). Additionally, during the following described operations, memory cells 610, 612, and 614 each have ground voltage applied to their respective sources 626, 632, and 620.

Through "impact ionization," as understood by one of ordinary skill in the art, a logic "1" may be written to memory cell 610 by applying a first positive voltage (e.g., 1.0 volt) to a gate 628 of memory cell 610. The first positive voltage (e.g., 1.0 volt) is, therefore, also applied to a gate 622 of memory cell 614. Additionally, a second positive voltage (e.g., 1.5 volts) having a greater potential than the first positive voltage applied to gate 628 of memory cell 610 may be applied to a drain 630 of memory cell 610. The second positive voltage (e.g., 1.5 volts) is, therefore, also applied to a drain 636 of memory cell 612. Furthermore, to prevent programming of adjacent memory cells 612 and 614, 0.0 volts may be applied to a drain 624 of memory cell 614 and a negative voltage (e.g., −1.5 volts) may be applied to a gate 634 of memory cell 612.

In addition, a logic "1" may be erased from memory cell 610 (i.e., writing a logic "0") by applying a positive voltage (e.g., 1.0 volt) to gate 628 of memory cell 610. The positive voltage (e.g., 1.0 volt) is, therefore, also applied to gate 622 of memory cell 614. Additionally, a negative voltage (e.g., −1.0 volt) may be applied to drain 630 of memory cell 610. The negative voltage (e.g., −1.0 volt) is, therefore, also applied to drain 636 of memory cell 612.

Using a gate-induced drain leakage (GIDL) current, as understood by one of ordinary skill in the art, a logic "1" may be written to memory cell 610 by applying a negative voltage (e.g., −2.5 volts) to gate 628 of memory cell 610. The negative voltage (e.g., −2.5 volts) is, therefore, also applied to gate 622 of memory cell 614. Additionally, a positive voltage (e.g., 1.8 volts) may be applied to drain 630 of memory cell 610. The positive voltage (e.g., 1.8 volts) is, therefore, also applied to drain 636 of memory cell 612. Furthermore, to prevent programming of adjacent memory cells 612 and 614, a negative voltage (e.g., −1.0 volt) may be applied to gate 634 of memory cell 612 and 0.0 volts may be applied to drain 624 of memory cell 614.

Moreover, to read a charge stored within memory cell 610, a first positive voltage (e.g., 1.0 volt) may be applied to gate 628 of memory cell 610. The first positive voltage (e.g., 1.0 volt) is, therefore, also applied to gate 622 of memory cell 614. Additionally, a second positive voltage (e.g., 0.3 volts) having a potential less than the first positive voltage applied to gate 628 of memory cell 610 may be applied to drain 630 of memory cell 610. The second positive voltage (e.g., 0.3 volts) is, therefore, also applied to drain 636 of memory cell 612. Furthermore, to prevent "reading" from adjacent memory cells 612 and 614, a negative voltage (e.g., −1.0 volt) may be applied to gate 634 of memory cell 612 and 0.0 volts may be applied to drain 624 of memory cell 614.

Figure 27:
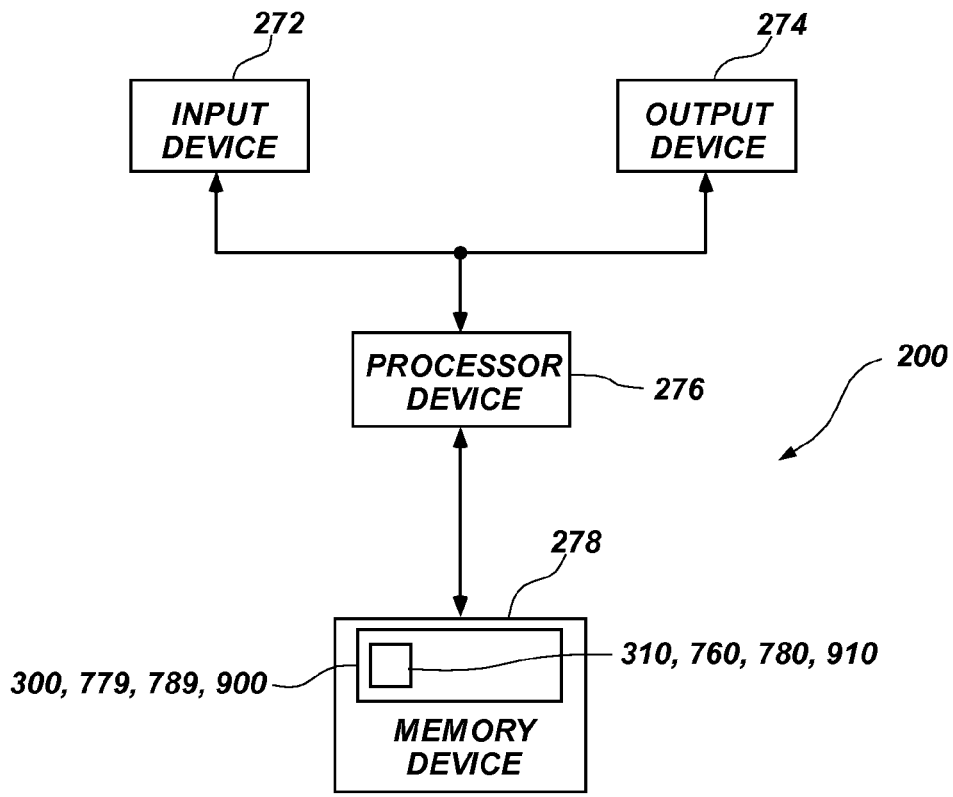
FIG. 27 is a block diagram of an electronic system, according to an embodiment of the present invention.
Figure 28:
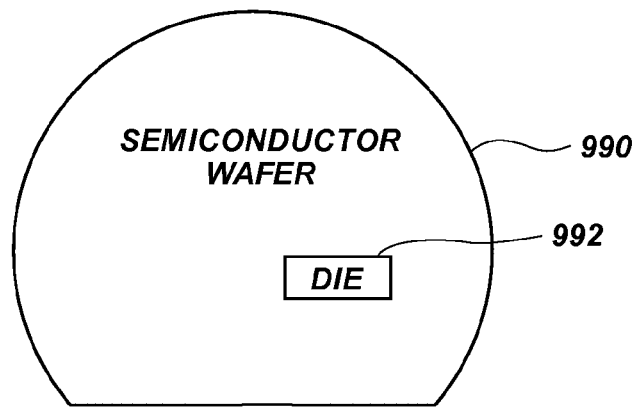
FIG. 28 is a diagram of a semiconductor wafer including an integrated circuit die incorporating a memory cell of one or more of the previous embodiments, in accordance with an embodiment of the present invention.

FIG. 27 is a block diagram of an electronic system, in accordance with an embodiment of the present invention. Electronic system 200 includes an input device 272, an output device 274, and a memory device 278, all coupled to a processor device 276. Memory device 278 incorporates at least one memory array 300, 900, 779, 789 including at least one memory cell 310, 910, 760, 780 of one or more of the preceding embodiments of the present invention. FIG. 28 is a diagram of a semiconductor wafer 990 including an integrated circuit die 992 incorporating the memory array and memory cells of one or more of the previous embodiments, in accordance with a further embodiment of the present invention.

Embodiments of the invention offer advantages over conventional memory technology and structures to implement same. For example, a small capacitor structure is employed in operation of the floating body. The floating body is remote from the source/drain regions, thus minimizing disturbance during operation. The bias gate, dielectric layer and floating body can be modeled independently from the FET, to minimize charge loss during operation. The technology is easily scalable, and pitch doubling may be employed to implement. In addition, the devices fabricated are stackable. Further, feature size (CD) may be reduced to 8F2 or smaller using pitch reduction technology.

CONCLUSION

Various embodiments of the present disclosure are described above and directed toward embodiments of a memory cell, a method of forming a memory cell, a memory device including a memory array having a plurality of memory cells, a method of operating a memory array, and an electronic system including at least one memory device including a memory array having a plurality of memory cells. In at least one embodiment, a memory cell may comprise a transistor over an insulation layer and including a source, and a drain. The memory cell may also include a floating body including a first region positioned between the source and the drain, a second region positioned remote from each of the source and drain, and a passage extending through the insulation layer and coupling the first region to the second region. Additionally, the memory cell may include a bias gate at least partially surrounding the second region and configured for operably coupling to a bias voltage. Furthermore, the memory cell may include a plurality of dielectric layers, wherein each outer vertical surface of the second region has a dielectric layer of the plurality adjacent thereto.

In at least one other embodiment, a method of operating a memory array including a plurality of memory cells may comprise applying a bias voltage to a bias gate at least partially surrounding a charge storing region of each memory cell of the plurality. The method may further include performing an operation on a memory cell comprising a transistor including a gate region, a source region, and a drain region. The operation performed on the memory cell may include either writing a charge to an associated charge storing region of the memory cell or reading a charge from the associated charge storing region of the memory cell. Moreover, the charge storing region is positioned remote from each of the gate region, the source region, and the drain region. Additionally, the charge storing region is coupled to another region comprising silicon positioned adjacent to and between the source region and drain region through a passage comprising silicon formed through an insulation material.

One or more other embodiments may comprise methods of forming a memory cell. A method may include forming a passage through an insulation layer overlying a silicon layer and forming another layer comprising silicon over the insulation layer, into the passage, and in contact with the silicon layer. The method may also include forming a plurality of trenches through the another layer, the insulation layer, and the silicon layer, wherein the passage is positioned between the plurality of trenches. Additionally, the method may include forming a dielectric layer adjacent each outer vertical surface of the silicon layer adjacent a trench of the plurality of trenches and extending from a top surface of the silicon layer to a bottom surface of the silicon layer. Furthermore, the method may comprise depositing a conductive material at least partially within each trench of the plurality to at least a depth above a top surface of the silicon layer. Moreover, the method may include forming a transistor over the insulation layer, wherein a drain region and a source region of the transistor overlie and are adjacent to the insulation layer with the another layer positioned therebetween.

In yet further embodiments, the disclosure includes a memory device comprising a memory array including a plurality of memory cells. According to various embodiments, each memory cell of the plurality may comprise a transistor overlying an insulation layer and comprising a drain region and a source region adjacent the insulation layer. Each memory cell may also include a floating body having a first region adjacent the drain region and the source region, a second region distant from the first region, and a passage extending through the insulation layer and coupling the first region to the second region. Furthermore, each memory cell may comprise a bias gate at least partially surrounding the second region and configured to be operably coupled to a bias voltage. Moreover, each outer vertical surface of the second region comprises a dielectric layer formed adjacent thereto and positioned between a vertical surface of the second region and the bias gate.

Still other embodiments of the disclosure include electronic systems. One or more embodiments of such systems may comprise at least one processor and at least one memory device including a plurality of memory cells. Each memory cell of the plurality may comprise a transistor having a drain region and a source region overlying and adjacent to an insulation layer. Each memory cell may also include a first region overlying the insulation layer and positioned between the source region and the drain region, a second region comprising silicon and remotely positioned from the first region, and a passage extending from the first region through the insulation layer to the second region. Furthermore, each memory cell may include a bias gate at least partially surrounding the second region and adapted for operable coupling to a bias voltage. Additionally, each memory cell may include a dielectric layer positioned adjacent each outer vertical surface of the second region and extending from a top surface of the second region to a bottom surface of the second region.

Specific embodiments have been shown by way of non-limiting example in the drawings and have been described in detail herein; however, the various embodiments may be susceptible to various modifications and alternative forms. It should be understood that the invention is not limited to the particular forms disclosed. Rather, the invention encompasses all modifications, equivalents, and alternatives falling within the scope of the following appended claims and their legal equivalents.

What is claimed is:

1. An apparatus, comprising:
a memory cell including:
a substrate;
a floating body overlying the substrate, the floating body including a first region and a second region that are at least partially separated from each other by an insulating material that defines a passage between the first region and the second region, wherein the first region of the floating body at least partially overlies the insulating material; and
a transistor overlying the floating body, the transistor including a source, a drain, and a gate that are proximate to the first region and remote from the second region of the floating body.

2. The apparatus of claim 1, wherein:
the first region comprises a vertical thickness of substantially 30 nanometers to 100 nanometers; and
the second region comprises a vertical thickness of substantially 50 nanometers to 200 nanometers.

3. The apparatus of claim 1, wherein the passage comprises a width that is relatively smaller than a length of the passage.

4. The apparatus of claim 3, wherein:
the width of the passage is between substantially 5 nanometers to 20 nanometers; and
the length of the passage is between substantially 50 nanometers to 150 nanometers.

5. The apparatus of claim 1, further comprising a conductive element adjacent each outer vertical surface of the second region of the floating body.

6. The apparatus of claim 5, wherein the conductive element extends from above a top surface of the second region to a bottom surface of the second region.

7. The apparatus of claim 5, wherein the conductive element at least partially surrounds the second region.

8. The apparatus of claim 1, further comprising a memory array including the memory cell.

9. The apparatus of claim 8, further comprising a structure including the memory array.

10. The apparatus of claim 8, further comprising a semiconductor wafer including a memory device including the memory array.

11. The apparatus of claim 8, further comprising an electronic system including:
a processor;
an input device operably coupled to the processor;
an output device operably coupled to the processor; and
a memory device operably coupled to the processor, wherein the memory device includes the memory array.

12. An apparatus, comprising:
a memory cell including:
a transistor including a gate region, a source region, and a drain region;
an insulating material; and
a floating body including:
a first region positioned between the source region and the drain region;
a second region configured as a charge storage region, the second region positioned remote from each of the source region and the drain region; and
a passage between the first region and the second region, wherein at least a portion of the insulating material extends horizontally between the first region and the second region to define the passage.

13. The apparatus of claim 12, wherein the passage comprises one of a positively doped silicon and a negatively doped silicon.

14. The apparatus of claim 12, wherein the transistor is selected from the group consisting of a planar transistor, a recessed channel transistor, and a finFET transistor.

15. The apparatus of claim 12, wherein the gate region extends into at least a portion of the first region of the floating body.

16. The apparatus of claim 12, further comprising a conductive element adjacent the second region of the floating body, the conductive element configured to operably couple to a bias voltage.

17. The apparatus of claim 16, wherein the conductive element is configured to couple to one of a positive bias voltage and a negative bias voltage.

18. The apparatus of claim 16, further comprising a dielectric material between the second region of the floating body and the conductive element, wherein the second region of the floating body, the dielectric material, and the conductive element function as a capacitor if the bias voltage is applied to the conductive element.

19. An apparatus comprising:
   a memory cell including:
      an insulation material;
      a transistor including a drain region and a source region; and
      a floating body including:
         a first region adjacent the drain region and the source region;
         a second region configured as a charge storage region distant from the first region; and
         a passage between the first region and the second region, the passage defined by the insulation material extending into the floating body, wherein the passage has a cross-sectional area that is less than individual cross-sectional areas of both the first region and the second region.

20. The apparatus of claim 19, wherein the second region has a cross-sectional area greater than a cross-sectional area of the first region.

21. The apparatus of claim 19, wherein the passage is negatively doped.

22. The apparatus of claim 21, wherein the first region is undoped.

23. The apparatus of claim 19, wherein the first region is positively doped relative to a doping concentration of the second region.

* * * * *